US012756398B2

(12) United States Patent
El-halwagy et al.

(10) Patent No.: US 12,756,398 B2
(45) Date of Patent: Oct. 6, 2026

(54) CLOCK TRACKING CIRCUIT WITH DIGITAL INTEGRAL PATH TO PROVIDE CONTROL SIGNALS FOR DIGITAL AND ANALOG INTEGRAL INPUTS OF AN OSCILLATOR

(71) Applicant: Microchip Technology Incorporated, Chandler, AZ (US)

(72) Inventors: Waleed El-halwagy, Ottawa (CA); William Roberts, Highland, UT (US); Mehran Aliahmad, Manotick (CA)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 17/823,418

(22) Filed: Aug. 30, 2022

(65) Prior Publication Data

US 2023/0179208 A1 Jun. 8, 2023

Related U.S. Application Data

(60) Provisional application No. 63/264,899, filed on Dec. 3, 2021.

(51) Int. Cl.
*H03L 7/099* (2006.01)
*H03L 7/091* (2006.01)

(52) U.S. Cl.
CPC ............ *H03L 7/0992* (2013.01); *H03L 7/091* (2013.01)

(58) Field of Classification Search
CPC ..... H03L 7/00; H03L 7/06; H03L 7/08; H03L 7/085; H03L 7/087; H03L 7/099; H03L 7/0991; H03L 7/0995; H03L 7/0996; H03L 7/0997; H03L 7/0998; H03L 2207/00; H03L 2207/06
See application file for complete search history.

(56) References Cited

U.S. PATENT DOCUMENTS 7,612,626 B2 11/2009 Tang
8,476,945 B2 * 7/2013 Elad .......................... H03L 7/06 327/159

(Continued)

OTHER PUBLICATIONS

International Search Report for International Application No. PCT/US2022/075692, mailed Nov. 30, 2022, 6 pages.

(Continued)

*Primary Examiner* — Diana J. Cheng
(74) *Attorney, Agent, or Firm* — TraskBritt

(57) ABSTRACT

One or more examples relate to an apparatus that includes an error detector, an oscillator, an analog proportional path, and a digital integral path. The oscillator includes an analog proportional input, a digital integral input, and an analog integral input. The analog proportional path provides a control signal for the analog proportional input of the oscillator. The digital integral path provides a control for the digital integral input and the analog integral input of the oscillator. A first signal path of an interface includes a direct coupling between the digital phase detector and integrator and the digital integral input of the oscillator. A second signal path of the interface includes a digital-to-analog converter (DAC) with a filtered delta-sigma modulator (DSM) input between the digital phase detector and integrator and the analog integral input of the oscillator.

17 Claims, 16 Drawing Sheets

(56) References Cited

U.S. PATENT DOCUMENTS

| | | | | |
|---|---|---|---|---|
| 8,704,567 | B2 * | 4/2014 | Ainspan | H03L 7/087 327/158 |
| 9,306,730 | B1 | 4/2016 | Shu et al. | |
| 9,344,271 | B1 * | 5/2016 | Dusatko | H03M 7/3015 |
| 9,455,728 | B2 * | 9/2016 | Deng | H03L 7/0995 |
| 9,837,959 | B2 * | 12/2017 | Ainspan | H03B 1/00 |
| 10,523,411 | B2 * | 12/2019 | Li | H03L 7/093 |
| 2012/0257693 | A1 | 10/2012 | Sindalovsky et al. | |
| 2013/0057327 | A1 | 3/2013 | Ferriss et al. | |
| 2013/0257485 | A1 | 10/2013 | Nikaeen et al. | |
| 2016/0065186 | A1 | 3/2016 | Ainspan et al. | |
| 2017/0250692 | A1 | 8/2017 | Motozawa et al. | |
| 2019/0305926 | A1 | 10/2019 | Li et al. | |

OTHER PUBLICATIONS

International Written Opinion for International Application No. PCT/US2022/075692, mailed Nov. 30, 2022, 10 pages.

* cited by examiner

600

| DAC In | DAC 0 For Segment 0 402 | | | DAC 1 For Segment 1 406 | | | DAC 2 For Segment 2 410 | | | DAC 3 For Segment 3 414 | | |
|---|---|---|---|---|---|---|---|---|---|---|---|---|
| | Bit 1 | Bit 0 | DSM | Bit 1 | Bit 0 | DSM | Bit 1 | Bit 0 | DSM | Bit 1 | Bit 0 | DSM |
| 0000 | 0 | 0 | DSM in | 0 | 0 | 0 | 0 | 0 | 0 | 0 | 0 | 0 |
| 0001 | 0 | 1 | DSM in | 0 | 0 | 0 | 0 | 0 | 0 | 0 | 0 | 0 |
| 0010 | 1 | 0 | DSM in | 0 | 0 | 0 | 0 | 0 | 0 | 0 | 0 | 0 |
| 0011 | 1 | 1 | DSM in | 0 | 0 | 0 | 0 | 0 | 0 | 0 | 0 | 0 |
| 0100 | 1 | 1 | 1 | 0 | 0 | DSM in | 0 | 0 | 0 | 0 | 0 | 0 |
| 0101 | 1 | 1 | 1 | 0 | 1 | DSM in | 0 | 0 | 0 | 0 | 0 | 0 |
| 0110 | 1 | 1 | 1 | 1 | 0 | DSM in | 0 | 0 | 0 | 0 | 0 | 0 |
| 0111 | 1 | 1 | 1 | 1 | 1 | DSM in | 0 | 0 | 0 | 0 | 0 | 0 |
| 1000 | 1 | 1 | 1 | 1 | 1 | 1 | 0 | 0 | DSM in | 0 | 0 | 0 |
| 1001 | 1 | 1 | 1 | 1 | 1 | 1 | 0 | 1 | DSM in | 0 | 0 | 0 |
| 1010 | 1 | 1 | 1 | 1 | 1 | 1 | 1 | 0 | DSM in | 0 | 0 | 0 |
| 1011 | 1 | 1 | 1 | 1 | 1 | 1 | 1 | 1 | DSM in | 0 | 0 | 0 |
| 1100 | 1 | 1 | 1 | 1 | 1 | 1 | 1 | 1 | 1 | 0 | 0 | DSM in |
| 1101 | 1 | 1 | 1 | 1 | 1 | 1 | 1 | 1 | 1 | 0 | 1 | DSM in |
| 1110 | 1 | 1 | 1 | 1 | 1 | 1 | 1 | 1 | 1 | 1 | 0 | DSM in |
| 1111 | 1 | 1 | 1 | 1 | 1 | 1 | 1 | 1 | 1 | 1 | 1 | DSM in |

FIG. 6

CLOCK TRACKING CIRCUIT WITH DIGITAL INTEGRAL PATH TO PROVIDE CONTROL SIGNALS FOR DIGITAL AND ANALOG INTEGRAL INPUTS OF AN OSCILLATOR

CROSS-REFERENCE TO RELATED APPLICATIONS

This application claims the benefit under 35 U.S.C. § 119(e) of the priority date of U.S. Provisional Patent Application Ser. No. 63/264,899, filed Dec. 3, 2021, for HYBRID PHASE-LOCKED-LOOP (PLL) FOR ULTRA LOW JITTER CLOCK GENERATION, the disclosure of which is incorporated herein in its entirety by this reference.

BACKGROUND

Phase locked loops are circuits utilized to track clocks and other oscillating signals. An output signal of a phase locked loop is locked to the phase and frequency of a reference signal. Phase locked loops are utilized in a variety of operational contexts, including when two signals having known relationships are utilized to transmit information.

BRIEF DESCRIPTION OF THE DRAWINGS

To easily identify the discussion of any particular element or act, the most significant digit or digits in a reference number refer to the figure number in which that element is first introduced.

FIG. 6 depicts an example table that defines predetermined relationships between values of second bits and values of bits to be provided to filtered DSMs.

DETAILED DESCRIPTION

Figure 1:
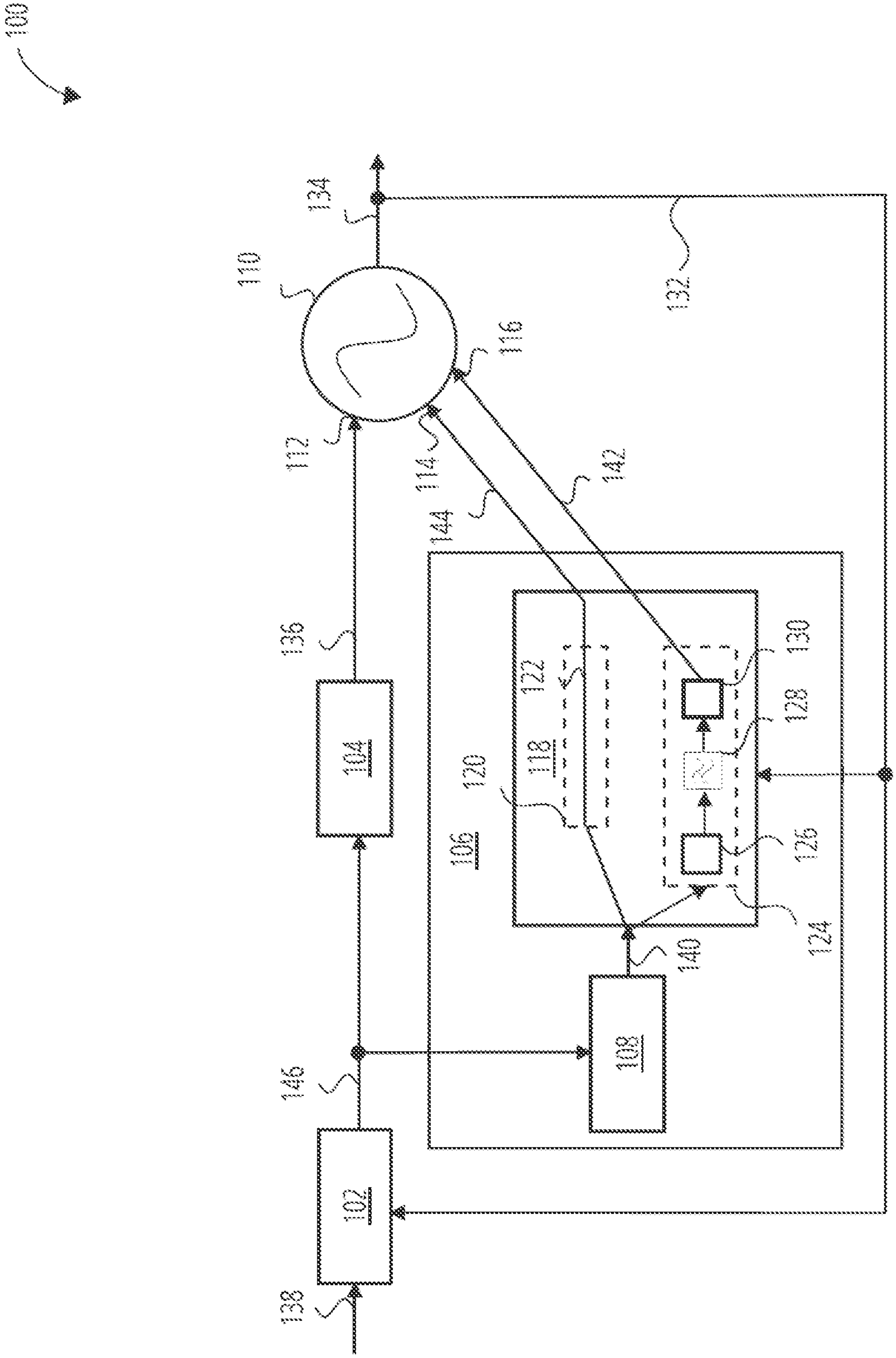
FIG. 1 is a block diagram depicting an apparatus for tracking a clock, in accordance with one or more examples.

In the following detailed description, reference is made to the accompanying drawings, which form a part hereof, and in which are shown, by way of illustration, specific examples of examples in which the present disclosure may be practiced. These examples are described in sufficient detail to enable a person of ordinary skill in the art to practice the present disclosure. However, other examples may be utilized, and structural, material, and process changes may be made without departing from the scope of the disclosure.

The illustrations presented herein are not meant to be actual views of any particular method, system, device, or structure, but are merely idealized representations that are employed to describe the examples of the present disclosure. The drawings presented herein are not necessarily drawn to scale. Similar structures or components in the various drawings may retain the same or similar numbering for the convenience of the reader; however, the similarity in numbering does not mean that the structures or components are necessarily identical in size, composition, configuration, or any other property.

The following description may include examples to help enable one of ordinary skill in the art to practice the disclosed examples. The use of the terms "exemplary," "by example," and "for example," means that the related description is explanatory, and though the scope of the disclosure is intended to encompass the examples and legal equivalents, the use of such terms is not intended to limit the scope of an example or this disclosure to the specified components, steps, features, functions, or the like.

It will be readily understood that the components of the examples as generally described herein and illustrated in the drawing could be arranged and designed in a wide variety of different configurations. Thus, the following description of various examples is not intended to limit the scope of the present disclosure, but is merely representative of various examples. While the various aspects of the examples may be presented in drawings, the drawings are not necessarily drawn to scale unless specifically indicated.

Furthermore, specific implementations shown and described are only examples and should not be construed as the only way to implement the present disclosure unless specified otherwise herein. Elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the examples disclosed herein may be implemented or performed with a general purpose processor, a special purpose processor, a Digital Signal Processor (DSP), an Integrated Circuit (IC), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor (may also be referred to herein as a host processor or simply a host) may be a microprocessor, but in the alternative, the processor may be any conventional processor, controller, microcontroller, or state machine. A processor may also be implemented as a combination of computing devices, such as a combination of a DSP and a microprocessor, a plurality of microprocessors, one or more microprocessors in conjunction with a DSP core, or any other such configuration. A general-purpose computer including a processor is considered a special-purpose computer while the general-purpose computer is configured to execute computing instructions (e.g., software code) related to examples of the present disclosure.

The examples may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a thread, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

Any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise, a set of elements may comprise one or more elements.

As used herein, the term "substantially" in reference to a given parameter, property, or condition means and includes to a degree that one of ordinary skill in the art would understand that the given parameter, property, or condition is met with a small degree of variance, such as, for example, within acceptable manufacturing tolerances. By way of example, depending on the particular parameter, property, or condition that is substantially met, the parameter, property, or condition may be at least 90% met, at least 95% met, or even at least 99% met.

In this description the term "coupled" and derivatives thereof may be used to indicate that two elements co-operate or interact with each other. When an element is described as being "coupled" to another element, then the elements may be in direct physical or electrical contact or there may be intervening elements or layers present. In contrast, when an element is described as being "directly coupled" to another element, then there are no intervening elements or layers present. The term "connected" may be used in this description interchangeably with the term "coupled," and has the same meaning unless expressly indicated otherwise or the context would indicate otherwise to a person having ordinary skill in the art.

Phase locked loops (PLLs) are used, generally, to generate clocks that track (e.g., are phase and frequency locked to, without limitation) a reference signal. In a typical hybrid PLL topology, an oscillator is controlled via a digital integral control path and an analog proportional control path to generate the clock having the desired phase and frequency. When the frequency is different from the desired frequency (also called "offset" or "error"), the PLL generates control signals to urge the oscillator's native frequency toward the desired frequency. At certain frequency ranges, a hybrid PLL may exhibit jitter, which is an integration of phase noise in specific bandwidths. At low offset frequencies, dominant sources of phase noise (also called "close-in phase noise") typically includes the electronic components present along the analog proportional path (e.g., a charge pump, without limitation), and the reference signal input. At high offset frequencies, a dominant source of phase noise typically is the voltage-controlled oscillator (VCO) noise.

Further, signals generated by or within a PLL may sometimes exhibit repeating patterns due to non-linear properties of a given PLL that cause disturbances, and are referred to in non-linear control theory as "limit cycles" or "limit cycle behavior." In a typical PLL, limit cycle behavior may manifest at any offset frequency.

The inventors of this disclosure appreciate desirability of PLL topologies that reduce or eliminate one or more of jitter, phase noise, limit cycles, or unwanted effects thereof.

FIG. 1 is a block diagram depicting an apparatus 100 for tracking a clock (and may also be referred to herein as a "clock tracking circuit 100"), in accordance with one or more examples. Apparatus 100 includes an error detector 102, an analog proportional path 104, a digital integral path 106, and a digital and analog controlled oscillator 110. Digital integral path 106 includes digital phase detector and integrator 108 and interface 118. Digital and analog controlled oscillator 110 includes analog proportional input 112, digital integral input 114, and analog integral input 116. A first signal path 120 of interface 118 includes direct coupling 122 between digital phase detector and integrator 108 and digital integral input 114. A second signal path 124 of interface 118 includes delta-sigma modulator (DSM) 126 ("DSM 126"), filter 128, and digital-to-analog converter (DAC) 130 ("DAC 130") that are serial coupled between digital phase detector and integrator 108 and analog integral input 116. The topology of the DAC 130, filters 128, and DSM 126 depicted by FIG. 1 may be referred to herein as a DAC with a filtered DSM input, and thus second signal path 124 may comprise the DAC with the filtered DSM input.

Apparatus 100 operates, generally, to generate an output signal 134 phase-locked to a reference signal 138. Error detector 102 generates an error signal 146 that represents a difference between feedback signal 132 and reference signal 138. In one or more examples, error signal 146 includes direction information and magnitude information. Such direction information indicates if output signal 134 is lagging in phase or leading in phase with respect to reference signal 138. Such magnitude information indicates an extent to which output signal 134 is lagging phase or leading in phase with respect to reference signal 138. In various examples, error signal 146 may be utilized to determine phase and frequency information about output signal 134, reference signal 138, and differences there between. Feedback signal 132 may be, or be at least partially based on (e.g., a frequency divided version, without limitation), output signal 134 generated by digital and analog controlled oscillator 110.

Apparatus 100 has a phase-locked loop (PLL) topology and, more specifically, a "hybrid" phase-locked loop topology that utilizes digital integral path 106 and analog proportional path 104, to generate control signals for digital and analog controlled oscillator 110, including, without limitation, analog proportional control signal 136, digital integrating control signal 144, and analog integrating control signal 142.

Digital and analog controlled oscillator 110, operates, generally, to generate output signal 134 exhibiting phase and frequency in response to the analog proportional control signal 136, digital integrating control signal 144, and analog integrating control signal 142 respectively received via analog proportional input 112, digital integral input 114, and analog integral input 116. Analog proportional path 104 includes one or more analog circuits or devices to provide analog proportional control signal 136 to adjust output signal 134 for transient correction of phase differences (also referred to herein as "phase error") between feedback signal 132 and reference signal 138 as indicated by error signal 146. In one or more examples, analog proportional input 112 may include a programmable VCO varactor.

Digital integral path 106 includes one or more digital circuits or devices to provide digital integrating control signal 144 and analog integrating control signal 142 to urge an average frequency of digital and analog controlled oscillator 110 toward a target frequency (e.g., a frequency of reference signal 138 or multiple thereof, without limitation) in response to a frequency difference (also referred to herein as a "frequency error") between feedback signal 132 and reference signal 138 indicated by error signal 146.

Digital phase detector and integrator 108 converts error signal 146 to a binary representation (e.g., a single-bit or multi-bit binary representation, without limitation), and integrates the digital representation to generate digital frequency error signal 140. Some bits of the digital frequency error signal 140 (e.g., the most-significant-bits (MSBs), without limitation) are utilized as digital integrating control signal 144 provided to digital integral input 114, and some other bits of digital frequency error signal 140 (e.g., the least-significant-bits (LSBs), without limitation) are utilized to control analog integral input 116, as analog integrating control signal 142, via second signal path 124.

Digital integral input 114 is utilized to adjust net capacitance of multiple varactors of digital and analog controlled oscillator 110 and thereby adjust (e.g., tune, without limitation) a frequency of digital and analog controlled oscillator 110. In one or more examples, values of respective bits of digital integral input 114 are utilized to control respective states of the multiple varactors of digital and analog controlled oscillator 110.

In one or more examples, the multiple varactors of digital and analog controlled oscillator 110 coupled to digital integral input 114 are ON/OFF varactors that respectively exhibit only two states responsive to digital integrating control signal 144: ON or OFF. The OFF state has a first effect on net capacitance of digital and analog controlled oscillator 110, the ON state has a second, different effect on net capacitance of digital and analog controlled oscillator 110.

Analog integral input 116 is utilized to adjust capacitance of one or more varactors of digital and analog controlled oscillator 110 and thereby finely adjust (e.g., finely tune, without limitation) the frequency of digital and analog controlled oscillator 110 (as compared to coarser adjustment via digital integral input 114). In one or more examples, the multiple varactors accessible via digital integral input 114 are different than the one or more varactors accessible via analog integral input 116. The one or more varactors of digital and analog controlled oscillator 110 coupled to analog integral input 116 adjust net capacitance of digital and analog controlled oscillator 110 at least partially responsive to a voltage level of analog integrating control signal 142 generated by DAC 130.

Interface 118 operates, generally, as an interface between digital phase detector and integrator 108 and both of digital integral input 114 and analog integral input 116 of digital and analog controlled oscillator 110. Interface 118 converts digital frequency error signal 140 into two components: (1) a first component provided via first signal path 120 directly to digital integral input 114 as digital integrating control signal 144; and (2) a second component converted to a continuous analog signal by second signal path 124 and provided to analog integral input 116.

At second signal path 124, DSM 126 generates an output signal that is proportional to the input signal (e.g., a pulse-width-modulated (PWM) signal with pulse-widths proportional to the input signal, or a stream of equal-width pulses with a density that is proportional to the input signal, without limitation) representation of at least a portion of digital frequency error signal 140 that is utilized to define the resolution of the digital phase detector and integrator 108. Filter 128 low pass filters the switching output signal generated by DSM 126 to generate a signal that represents an average of the switching output signal. DAC 130 combines the filtered DSM output with at least a portion of digital frequency error signal 140 to generate analog integrating control signal 142, as discussed below.

Figure 2:
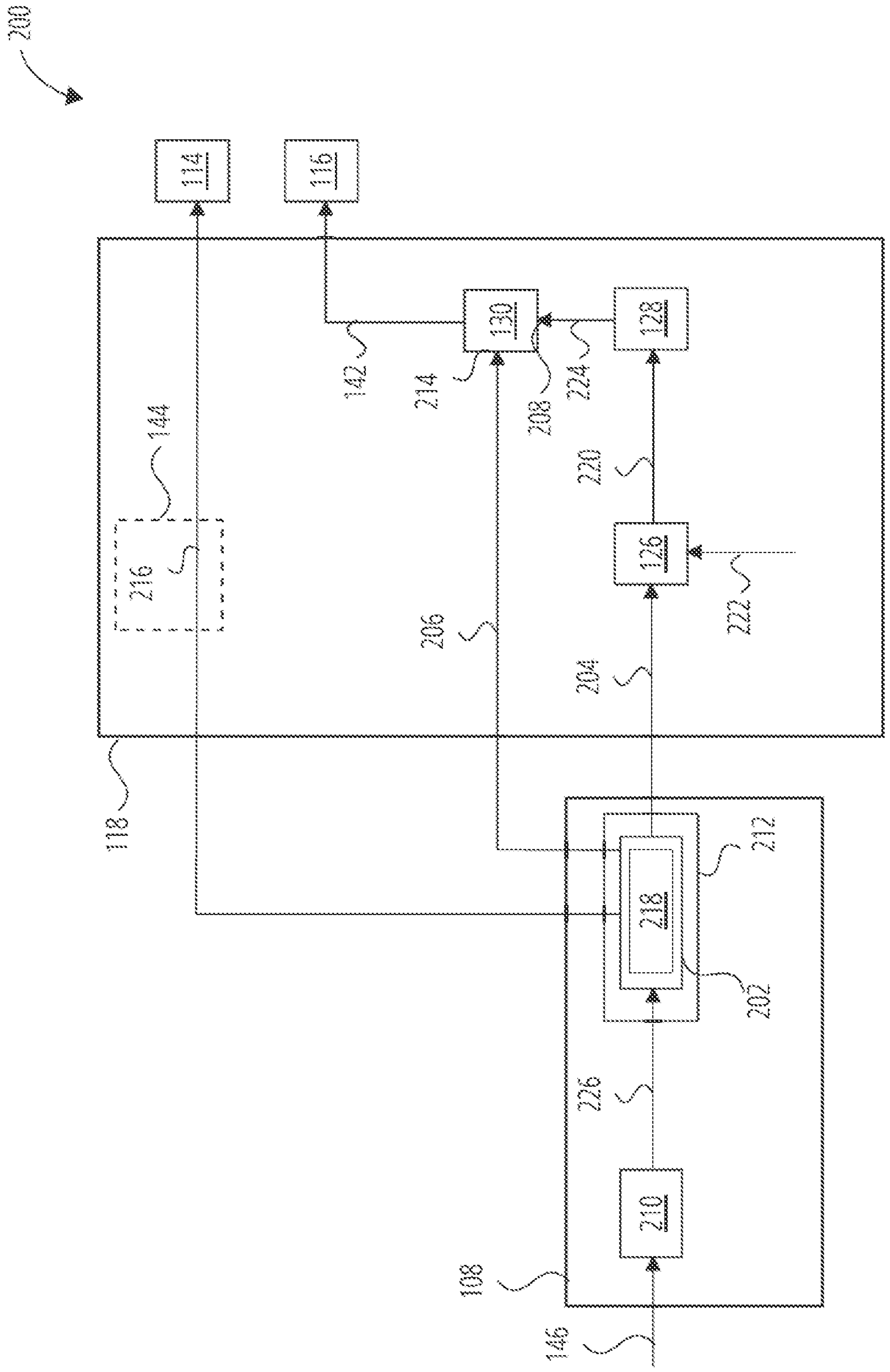
FIG. 2 is a diagram of a PLL portion for digital integral path control of digital and analog integral inputs of an oscillator, in accordance with one or more examples.

FIG. 2 is a diagram of a PLL portion 200 for digital integral path control of digital and analog integral inputs of an oscillator, in accordance with one or more examples. PLL portion 200 generates digital integrating control signal 144 and analog integrating control signal 142 for digital integral input 114 and analog integral input 116, respectively, in accordance with one or more examples. PLL portion 200 is a non-limiting example of digital integral path 106 of FIG. 1. Digital phase detector and integrator 108 of PLL portion 200 includes binary phase error detector 210 and digital integrator 212. Digital integrator 212 includes accumulation register 202 to store integrated phase error value 218. Interface 118 of PLL portion 200 includes DSM 126, filter 128 and DAC 130 of FIG. 1.

Binary phase error detector 210 outputs digital phase error signal 226, which is a binary representation of error signal 146. In one or more examples, binary phase error detector 210 may be a bang-bang phase detector (BBPD) that generates a single-bit representation of error signal 146, and the single-bit representation includes direction information, but not magnitude information. In one or more examples, binary phase error detector 210 may be a time-to-digital converter (TDC) that generates a multi-bit representation of error signal 146, and the multi-bit representation may include direction information and magnitude information.

Accumulation register 202 operates as digital integrator 212 and accumulates digital phase error signal 226 to store integrated phase error value 218, which represents digital frequency error signal 140 of FIG. 1. For a given number of accumulator bits N at accumulation register 202, $2^{\wedge N}$ accumulator steps may be applied to the various varactors of digital and analog controlled oscillator 110 via digital integral input 114 and analog integral input 116. The accumulator steps correspond to incremental voltage changes that may be applied to varactors of digital and analog controlled oscillator 110.

For a given integrated phase error value 218 stored at accumulation register 202, DSM 126 is coupled to receive first bits 204 of integrated phase error value 218 from accumulation register 202, and DAC 130 is coupled to receive second bits 206 of integrated phase error value 218 at digital input 214. First bits 204 and second bits 206 may be collectively referred to herein as the "least-significant-bits" ("LSBs") of integrated phase error value 218 at accumulation register 202. Interface 118 is coupled to directly provide third bits 216 of integrated phase error value 218 to digital integral input 114 as digital integrating control signal 144. Third bits 216 may also be referred to herein as "most-significant-bits" of ("MSBs") of integrated phase error value 218 at accumulation register 202.

DSM 126 provides switching signal 220, which represents first bits 204, while clocked by first frequency divided feedback signal 222, which is a pre-scaled or frequency-divided version of output signal 134 generated by digital and analog controlled oscillator 110. The clocking frequency of DSM 126 (here set by a frequency of first frequency divided feedback signal 222) defines the oversampling ratio of DSM 126. More specifically, in one or more examples, DSM 126 converts first bits 204 of integrated phase error value 218 to a single-bit signal represented by a switching signal with average pulse-width or average density representing first bits 204.

Filter 128 is a low pass filter (i.e., low pass frequency filter) that generates a filtered switching signal 224 that is an average of switching signal 220, i.e., an averaged switching signal 220. Stated another way, by utilizing filter 128, the least-significant-bit (LSB) input 208 of DAC 130 effectively receives an average of switching signal 220. LSB input 208 may also be called a control input of DAC 130. Thus, changes in first bits 204 are reflected as a more gradual change in filtered switching signal 224, and DAC 130 responds (e.g., the output of DAC 130, analog integrating control signal 142, exhibits changes, without limitation) to the average changes instead of instantaneous changes, such as instantaneous changes caused by DSM output spurs or other intrinsic or deterministic phase noise in the circuit, without limitation.

DAC 130 combines second bits 206 and filtered switching signal 224, which represents the average change of first bits 204, to generate analog integrating control signal 142, as discussed below. Second bits 206 are provided to further bits of the digital input of DAC 130 (e.g., the next most significant bits after the LSB of digital input 214 of DAC 130, without limitation). Bits received at digital input 214 of DAC 130 (e.g., second bits 206, without limitation) coarsely control an amplitude of analog integrating control signal 142, and bits received at the LSB input 208 of DAC 130 (e.g., as filtered switching signal 224, without limitation) finely control amplitude of analog integrating control signal 142.

DAC Input Examples

In one or more examples, fine control of voltage levels of analog integrating control signal 142 via second signal path 124 may be utilized to reduce the size or number of gaps (e.g., voltage level gaps, without limitation) exhibited by a waveform of an output of DAC 130, and, accordingly, exhibited by analog integrating control signal 142.

The first bits 204 are applied, as discussed below, to the LSB bit of DAC 130 via second signal path 124, so the effect of first bits 204 on the range of the output of DAC 130 will be 0 to (1/number of bits utilized by the DAC)*(DAC range). As a non-limiting example, for a 4-bit DAC with a 1.5 MHz range, the effect of first bits 204 is 1/16*(1.5 MHz).

In one or more examples, division of the bits of integrated phase error value 218 and distribution for generation of digital integrating control signal 144 and analog integrating control signal 142 may be chosen at least partially based on a variety of factors. Non-limiting examples of factors include a desired integral path resolution or a desired temperature range for digital and analog controlled oscillator 110.

Figure 3:
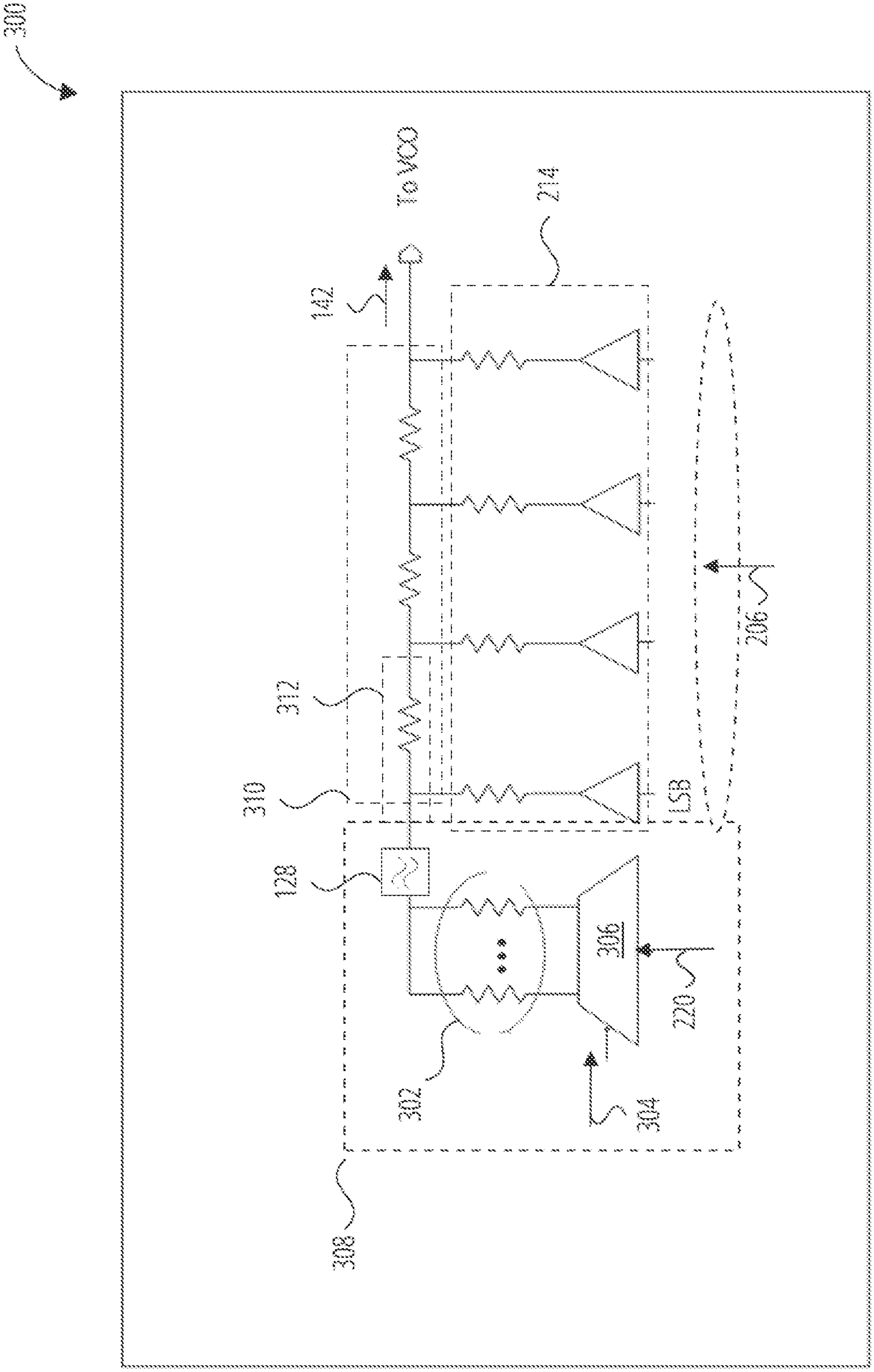
FIG. 3 is a simplified circuit diagram of a digital-to-analog converter input, in accordance with one or more examples.

FIG. 3 is a simplified circuit diagram of a DAC 300 in accordance with one or more examples. DAC 300 is a non-limiting example of a DAC 130 with filter 128 at an input. DAC 300 includes digital input 214, configurable input 308, and digital-to-analog conversion path 310. Configurable input 308 includes selectable gain paths 302, selection circuit 306, and filter 128.

Digital input 214 receives bits of the digital signal to be converted by DAC 300, here, second bits 206 of integrated phase error value 218. Configurable input 308 receives switching signal 220 that represents first bits 204 of integrated phase error value 218.

Digital-to-analog conversion path 310 is the path along which second bits 206, in combination with switching signal 220, are converted to analog integrating control signal 142. The various resistors of DAC 300 depicted by FIG. 3 form a resistive voltage-divider network that is discussed below.

Configurable input 308 includes selectable gain paths 302 utilized to selectably gain switching signal 220. Selectable gain paths 302 include multiple gain paths that may be selected to apply respective, different, gains to switching signal 220. Generally, respective gains of selectable gain paths 302 are proportional to respective resistances of selectable gain paths 302. Accordingly, in one or more examples, respective gains of selectable gain paths 302 may be set by setting respective resistances of selectable gain paths 302.

Selection circuit 306 couples switching signal 220 (e.g., coupled an output of DSM 126, without limitation) to a selected one of selectable gain paths 302 in response to select signal 304. In one or more examples, select signal 304 may be a configuration signal having a state set in response to, as a non-limiting example, a value of a configuration register utilized to set a gain requirement for configurable input 308. Such a configuration signal or value of a configuration register may be set, as a non-limiting example, during set up of DAC 300 or apparatus 100, more generally.

An output of configurable inputs 308 is coupled through filter 128 to an output of the LSB gain path of digital input 214. By coupling the output of configurable input 308 to the output of the LSB gain path of digital input 214, the resistive voltage divider of DAC 300 scales the frequency of gained and filtered switching signal 220 (e.g., the filtered switching signal 224 of FIG. 2) to within a frequency range of the LSB of DAC 300 and, accordingly, a step level of DAC 300. By way of non-limiting example, if a DAC bit step is 160 kHz, then the gained filtered DSM output, i.e., the gained filtered switching signal 224, will be within 160 kHz.

The scaled, filtered, and gained switching signal 220 provides interpolation between adjacent DAC steps of DAC 300. Absent scaled, filtered, and gained switching signal 220, analog integrating control signal 142 may exhibit discrete signal levels in response to DAC steps of DAC 300. Scaled, filtered, and gained switching signal 220 provides interpolation between adjacent DAC steps so analog integrating control signal 142 has a more continuous waveform and, thus, finer tune control of analog integral input 116. In one or more examples, a degree of interpolation provided by scaled, filtered, and gained switching signal 220 may be set, at least in part, by choosing a gain at configurable input 308 that reflects a desired degree of interpolation.

Segmented Varactor Examples

A relationship between change in oscillator frequency and change in analog integrating control signals may be non-linear. A non-linear relationship between change in capacitance of a varactor and a change in amplitude of analog integrating control signal may contribute to the non-linear relationship between change in oscillator frequency and change in analog integrating control signals. Oscillator frequency gain is generally linear at the start of the output range of the DAC generating the analog integrating control signal, but the gain diminishes toward the end of the output range of the DAC.

The inventors of this disclosure appreciate that it may be desirable to reduce such gain reduction toward the end of the output range of the DAC, and in other words, increase gain realized toward the end of the output range of the DAC.

One or more examples relate, generally, to utilizing multiple varactors in pre-determined operating regions (i.e., to effect pre-determined oscillator frequency ranges) chosen for generally linear oscillator frequency response exhibited when the respective varactors operate in their pre-determined operating regions. In one or more examples, respective multiple DACs 130 may be coupled to respective multiple varactors via an analog integral input 116. A respective varactor may be controlled, as discussed below, to operate in a pre-determined operating region. Respective operating regions may be chosen so that a curve that represents oscillator frequency versus control voltage, DAC code for generating the control voltage, or value represented by DAC code, exhibits a substantially linear relationship, as discussed below. In one or more examples, respective operating regions of selected varactors may be different or may partially overlap as discussed herein.

Respective varactors utilized to control oscillator frequency via an analog integral input may be referred to herein as a "varactor segment," and such varactor segments may collectively be referred to herein as a "segmented varactor." A sub-group of varactor segments of a segmented varactor may be referred to herein as a "varactor region." A varactor region may be associated with an oscillator frequency range, i.e., an associated operating region of a varactor region, chosen and configured as discussed below. In one or more examples, a segmented varactor may include one or more varactor regions.

Figure 4:
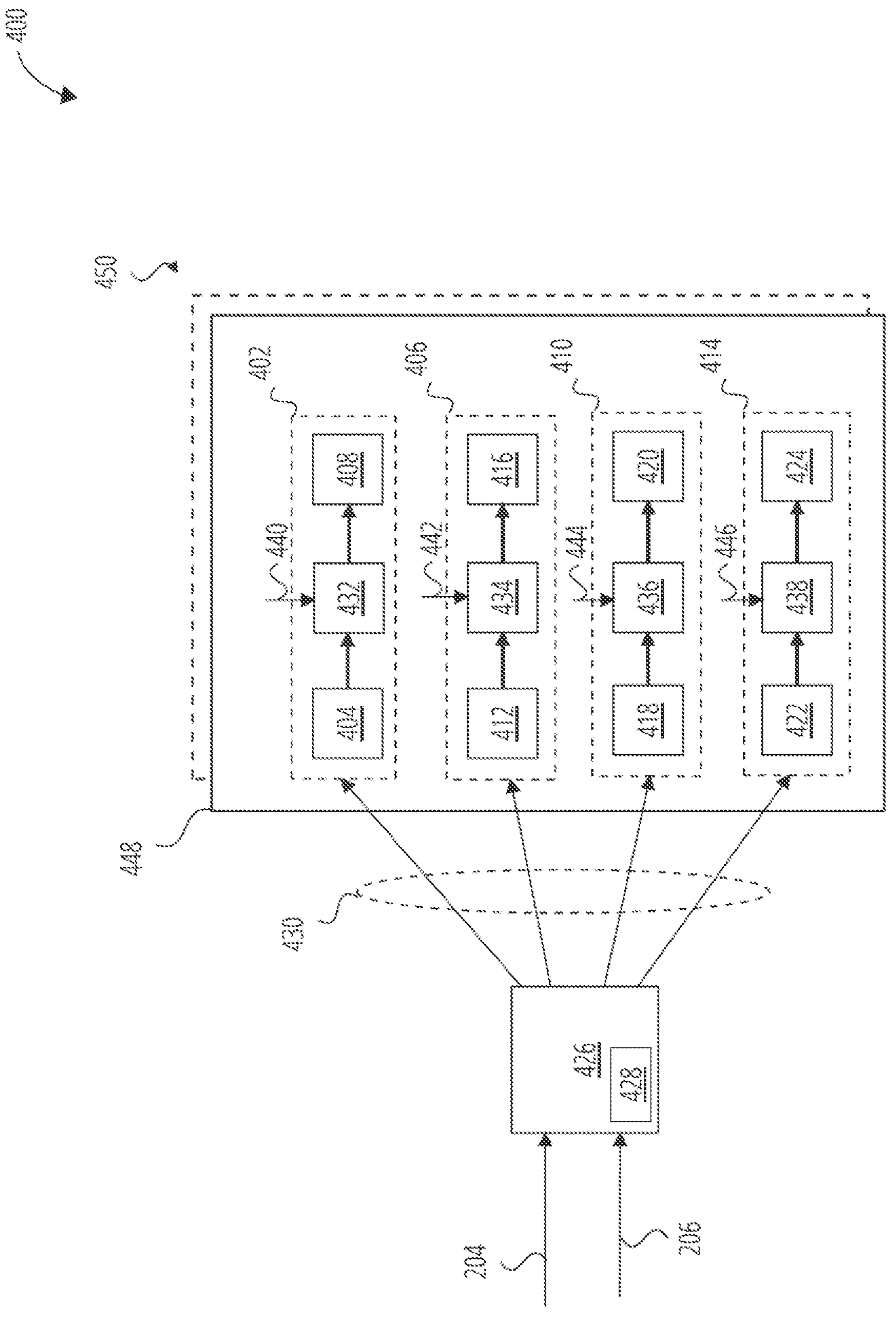
FIG. 4 is a diagram depicting a PLL portion for control of multiple varactor segments, in accordance with one or more examples.

FIG. 4 is a diagram depicting a PLL portion 400 for control of multiple varactor segments of a varactor region or segmented varactor, in accordance with one or more examples. PLL portion 400 includes mapping logic 426 and segmented varactor 450. Segmented varactor 450 includes one or more varactor regions, including varactor region 448. Varactor region 448 includes varactor segments 402, 406, 410, and 414 (varactor segments also referred to herein as just "segments"). Varactor segment 402 includes filtered DSM 404, DAC 432, and varactor 408. Varactor segment 406 includes filtered DSM 412, DAC 434, and varactor 416. Varactor segment 410 includes filtered DSM 418, DAC 436, and varactor 420. Varactor segment 414 includes filtered DSMs 422, DAC 438, and varactor 424. Mapping logic 426 includes table 428. Respective filtered DSMs 404, 412, 418, and 422 may include a respective filter 128 coupled to filter an output of a respective DSM 126. Respective DACs 432, 434, 436 and 438 may include a DAC 130.

Figure 5:
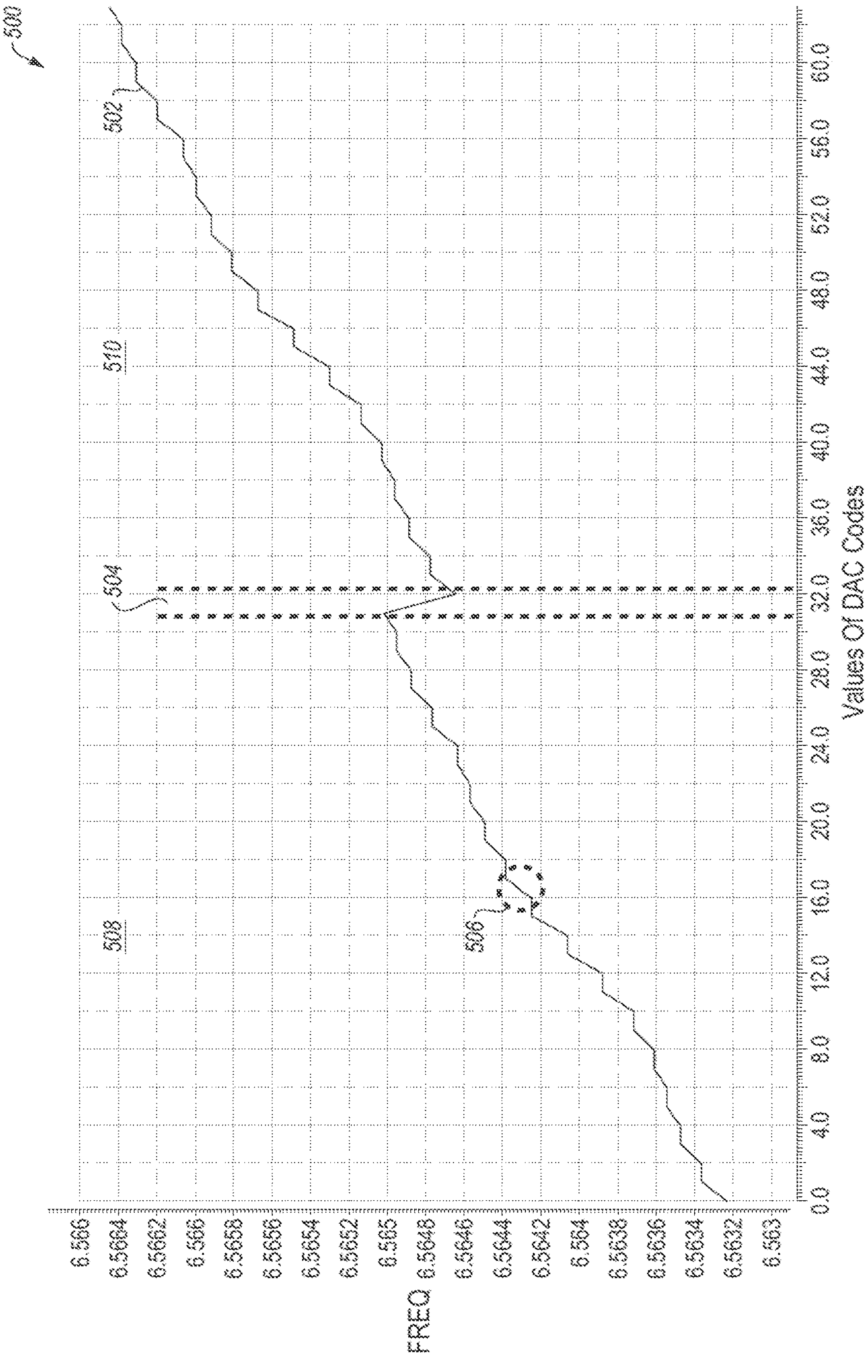
FIG. 5 depicts a graph that includes curves for frequency/voltage relationship for an example segmented varactor.

Turning to FIG. 5, FIG. 5 depicts a graph 500 that includes a curve 502 that represents a frequency/value of DAC codes relationship for example varactor regions 508 and 510. Varactor regions 508 and 510 may be activated in response to DAC codes, which may be at least partially based on first bits 204 and second bits 206. As a specific non-limiting example, where the LSB of DAC codes 430 is from first bits 204, the next five bits are from second bits 206, then '000000'-'011111' (i.e., values 0 to 31) correspond to varactor region 508, and '100000'-'111111' (i.e., values 32 to 62) correspond to varactor region 510, where the last two bits (left most two bit positions) in these example codes control the varactor regions.

The x-axis of graph 500 is values of DAC codes 430, in this specific non-limiting example, from 0.0 to 62.0. The y-axis of graph 500 is the oscillator frequency, in this specific non-limiting example from 6.5630 Hz to 6.5666 Hz. The oscillator frequency generally increases as values of the DAC codes increase and decreases as values of the DAC codes decrease. In a case of a single varactor, the control voltage applied to the single varactor would generally increase or decrease proportionally as values of DAC codes increase or decrease, but capacitance would increase or decrease non-linearly in response to increasing or decreasing voltage, and so the oscillator frequency would increase or decrease non-linearly in response thereto. When multiple varactor segments or varactor regions of a segmented varactor chosen as discussed below are set, as discussed below, to operate in adjacent frequency ranges, the voltage applied to the respective ones of the multiple varactors generally increases or decreases proportionally and substantially linearly as the value of the DAC code increases, the capacitance generally increases or decreases proportionally and substantially linearly in response to the values of the DAC codes increasing or decreasing, and oscillator frequency generally increases or decreases proportionally in a substantially linear manner in response to the capacitance increasing or decreasing, as illustrated by curve 502.

Turning back to FIG. 4, respective operating regions of varactor segments 402, 406, 410, and 414 may be set, at least in part, via respective ones of configuration signals 440, 442, 444, and 446, as a non-limiting example during set up of a PLL portion 400, or apparatus 100 more generally. As discussed below, configuration signals 440, 442, 444, and

446 control the range of output voltages of DACs 432, 434, 436, and 438, and thus the range of control voltages applied to respective varactors 408, 416, 420, and 424.

In one or more examples, configuration signals 440, 442, 444, and 446 may be applied to one or more of the most-significant-bits (MSBs) of respective digital inputs of DACs 432, 434, 436, and 438. The MSBs control a portion of the total output voltage range of the DACs 432, 434, 436, and 438, and so the configuration signals 440, 442, 444, and 446 may be utilized to define the output voltage range of respective DACs 432, 434, 436, and 438.

The number of MSBs utilized to set the operating regions may control the number of available varactor regions, i.e., $2^N$ varactor regions, where N is the number of MSBs coupled to receive a configuration signal. As a specific non-limiting example, assume again each DAC has a 6-bit digital input. If four LSBs of a DAC control 500 mV of output voltage range, the two MSBs control 2V of output voltage range of a DAC, so each value represented by the MSBs controls 500 mV, e.g., '00' controls 0-499 mV, '01' controls 500-999 mV, '10' controls 1000-1499 mV, and '11' controls 1500-2000 mV.

Once configuration signals 440, 442, 444 and 446 are set, respective ones of varactor segments 402, 406, 410, and 414 operate at least at the start of its operating region.

Mapping logic 426 generates DAC codes 430 at least partially responsive to first bits 204 and second bits 206 of integrated phase error value 218. Table 428 provided at mapping logic 426 defines predetermined relationships between first bits 204 and second bits 206 and DAC codes 430 provided to digital inputs of DACs 432, 434, 436 and 438, and bit values of bits provided to filtered DSMs 404, 412, 418, or 422. In other words, table 428 associates first and second bits 204/206 with DAC codes 430.

FIG. 6 depicts a table 600, which is a non-limiting example of a table 428 in accordance with one or more examples. The example table depicted by FIG. 6 utilizes 2-bit DAC codes, but the number of bits in these examples is illustrative and not intended to limit the scope in any way.

Table 600 includes columns for "DAC IN" (e.g., second bits 206, without limitation), DAC 0 for segment 0 402, DAC 1 for segment 1 406, DAC 2 for segment 2 410, and DAC 3 for segment 3 414. Table 600 includes sub-columns arranged below the segment columns. Respective sub-columns are for Bit 0 (specifying a bit value provided to the bit<0> digital input of a DAC of the given segment), Bit 1 (specifying a bit value provided to the bit<1> digital input of a DAC of the given segment), and DSM (where "DSM IN" specifies that first bits 204 of integrated phase error value 218 are provided directly to a filtered DSM input of the DAC of the given segment, and "0" specifies that a bit value of '0' is provided directly to the filtered DSM input of the DAC of the given segment).

Each cell in the "DAC IN" column specifies a different sequence of second bits 206. Groups of sequences of second bits 206 are assigned (within the table 600) to respective ones of varactor segments 402, 406, 410, and 414. Entries in the sub-columns of a varactor segments assigned to specific groups of sequences of second bits 206 are outlined in FIG. 6 by broken lines. For example, codes 0000, 0001, 0010, and 0011 are assigned varactor segment 402; 0100, 0101, 0110, and 0111 are assigned to varactor segment 406; 1000, 1001, 1010, and 1011 are assigned to varactor segment 410; and 1100, 1101, 1110, and 1111 are assigned to varactor segment 414.

In a contemplated operation, the codes identified by the cells for the "Bit 1" and "Bit 0" sub-columns of table 600 in respective outlined boxes are provided to the digital input of the respective DAC of an assigned segment, and first bits 204 are provided to the respective filtered DSM input of the DAC of the assigned segment. The DAC inputs and filtered DSM inputs of unassigned segments are sent the codes specified in respective cells of their respective columns for the rows that correspond to the specified code. Those codes may be all 0's if a given unassigned varactor segment has not been activated, yet. It may be all 1's if a given unassigned segment has been activated and the respective DAC has reached max output voltage, as discussed below.

In a contemplated operation, as accumulation register 202 accumulates sequentially, the values represented by second bits 206 increase or decrease sequentially, and mapping logic 426 activates or deactivates varactor segments 402, 406, 410 and 414 sequentially. For example, first the voltage applied to varactor 408 is increased to the top of the operating range of varactor segment 402, then the voltage applied to varactor 416 is increased to the top of the operating range of varactor segment 406, then the voltage applied varactor 420 is increased to the top of the operating range of varactor segment 410, and finally the voltage applied to varactor 424 is increased to the top of the operating range of varactor segment 414.

It will be appreciated that, in one or more examples, when a voltage is first applied to given varactors 408, 416, 420 and 424, the voltage applied to the varactor of previous varactor segments in a varactor region or segmented varactor may be maintained, as a non-limiting example, by utilizing thermometer coding techniques. In this manner, the affect that the applied voltage on the varactors has on the frequency of the oscillator may be additive in a given operation. The same generally holds true for reducing the effect that applied voltage on the varactors has on the frequency of the oscillator, except in reverse. In one or more examples, voltages applied to varactors 408, 416, 420 and 424 may be decreased in reverse order of the increase.

In one or more examples, frequency gaps may be reduced by overlapping respective frequency ranges of adjacent (i.e., adjacent frequency ranges) varactor segments of a segmented varactor, or overlapping frequency ranges of adjacent varactor regions of segmented varactors. Indeed, in one or more examples, areas of frequency overlap may, in some examples, define the extent of varactor regions of a segmented varactor.

Frequency gaps are jumps, discontinuities, or otherwise abrupt changes in oscillator frequency. Frequency gaps between adjacent varactor segments and varactor regions may be associated with noise due to limit cycles, so overlapping the frequency ranges of varactor segments or varactor regions may reduce noise due to limit cycles.

Turning to FIG. 5, example frequency overlap 504 between varactor region 508 and varactor region 510 (and between DAC codes '31.0' and '32.0' on the x-axis) is depicted at graph 500. In one or more examples, the oscillator frequency range associated with values of DAC codes represented by second bits 206 is associated with one of the multiple varactors coupled with analog integral input 116, and a DAC range can be set to be more or less for second bits 206 by selecting operating varactor ranges for each segment such that the associated oscillator frequency ranges overlap. In the specific example depicted by FIG. 5, oscillator frequency ranges associated with segmented varactors 508 and 510 overlap between 6.5646 Hz and 6.5650 Hz. Eliminating or reducing gaps between adjacent oscillator frequency ranges associated with adjacent varactor regions, such as varactor regions 508 and 510, reduces noise, including without limitation noise due to limit cycles.

Turning yet again back to FIG. 5, example interpolated frequencies 506 between DAC codes for '16.0' and '17.0' is depicted in graph 500. A voltage applied to a varactor segment generally increases as values of DAC codes represented by first bits 204 increase, and the oscillator frequency generally increases as the voltage applied to the varactor segment increases. The range of such a frequency increase in response to increases in values of DAC codes represented by first bits 204 corresponds to the interpolated frequencies 506 depicted in graph 500. Eliminating or reducing gaps between oscillator frequency ranges associated with adjacent DAC values (e.g., values 16.0 and 17.0 depicted in graph 500), reduces noise, including without limitation noise due to limit cycles.

Figure 7:
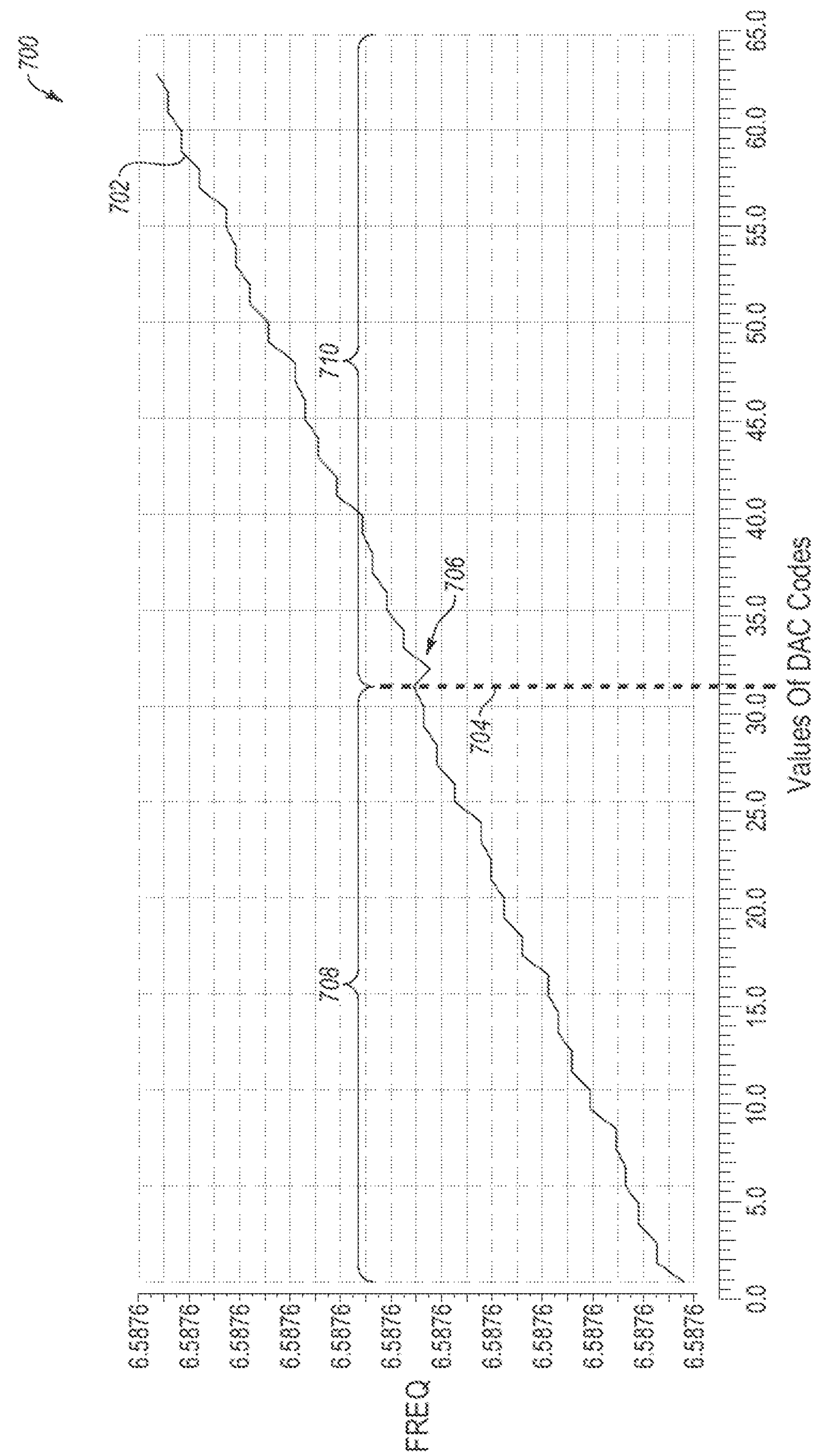
FIG. 7 depicts a graph that includes curves for frequency/voltage relationship for example varactor regions of a segmented varactor.

FIG. 7 depicts a graph 700 that includes curves for frequency/voltage relationship for an example segmented varactors as discussed herein.

The y-axis of graph 700 includes increasing (from bottom to top of the page) values of oscillator frequency, and the x-axis includes increasing (from left to right of the page) values of DAC codes 430. Line 702 represents the frequency response of an oscillator (e.g., digital and analog controlled oscillator 110, without limitation) for a range of values of DAC codes and DSM codes (e.g., represented by first bits 204 and second bits 206, without limitation).

A dashed vertical line depicted at FIG. 7 represents rollover 704. Rollover 704 occurs just after values of DAC codes where the 4-bit codes rollover from 0000 to 1111. A range of DAC codes associated with a varactor region may be referred to herein as a "code region." A first varactor region 708 is defined between values 0 and 31 (a first code region), and a second varactor region 710 is defined between values 31 and 65 (a second code region). In one or more examples, gaps may be reduced by overlapping the frequency ranges of one or more adjacent (in terms of frequency range) code regions. Example frequency overlap 706 is depicted at rollover 704.

Overlapping frequency ranges of adjacent code regions may reduce and/or eliminate frequency gaps between adjacent code regions and, accordingly, adjacent varactor regions. Such gaps are associated with noise due to limit cycles, so eliminating or reducing gaps may reduce noise associated with limit cycles.

Figure 8:
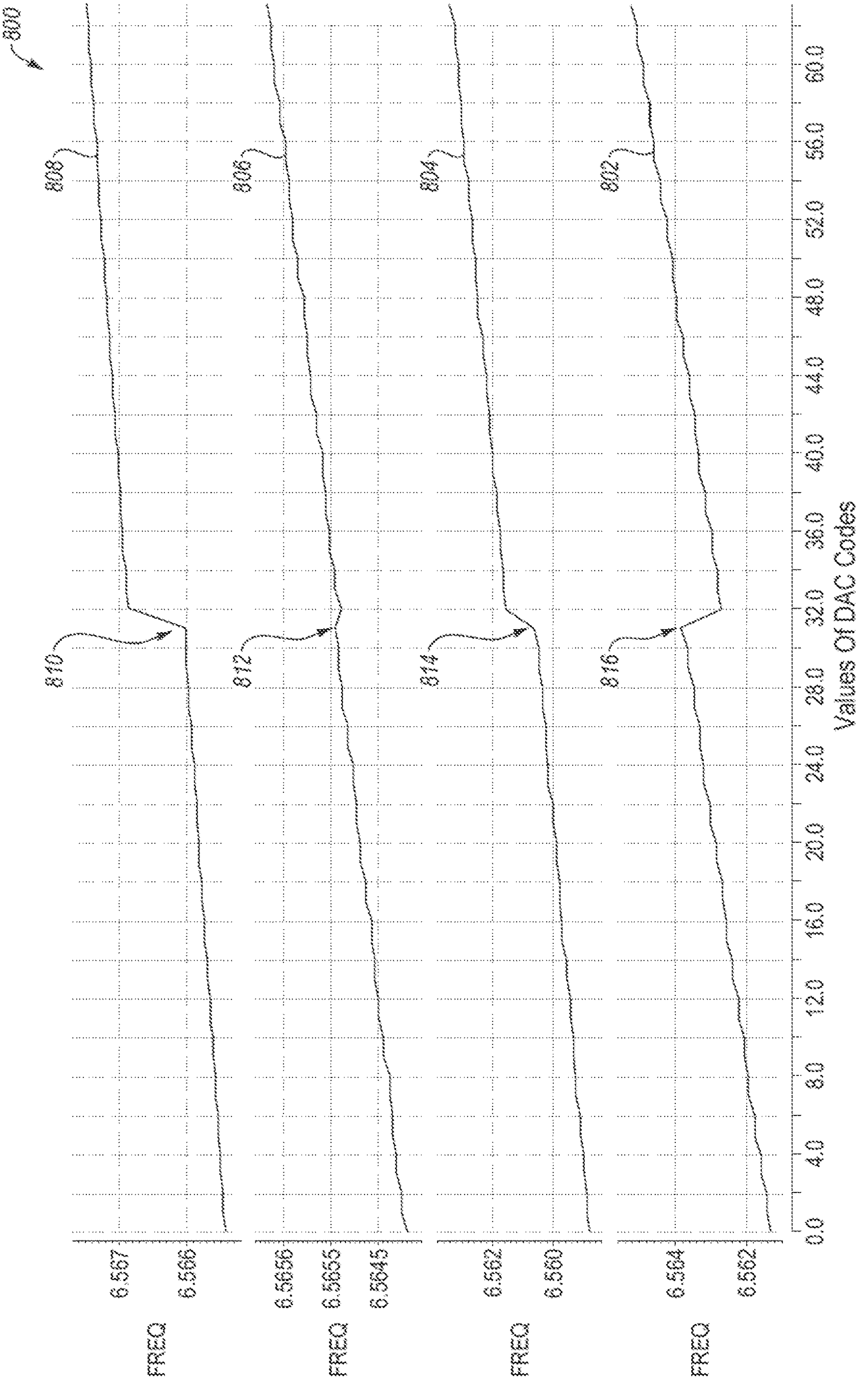
FIG. 8 depicts a graph that includes a frequency overlap between adjacent code segments, in accordance with one or more examples.

FIG. 8 depicts a graph 800 that includes example curves 802, 804, 806 and 808, that represent various example oscillator frequency responses for ranges of values of DAC codes. Example curves 802 and 806 exhibit various degrees of example frequency overlap between adjacent code regions (overlap 816 and 812, respectively), while example curves 804 and 808, exhibit various degrees of example frequency gaps between adjacent code regions (gap 814 and 810, respectively). In graph 800, curve 802 exhibits greater frequency overlap than curve 806 (overlap 816>overlap 812), and curve 808 exhibits greater frequency gap than curve 804 (gap 814<810).

Figure 9:
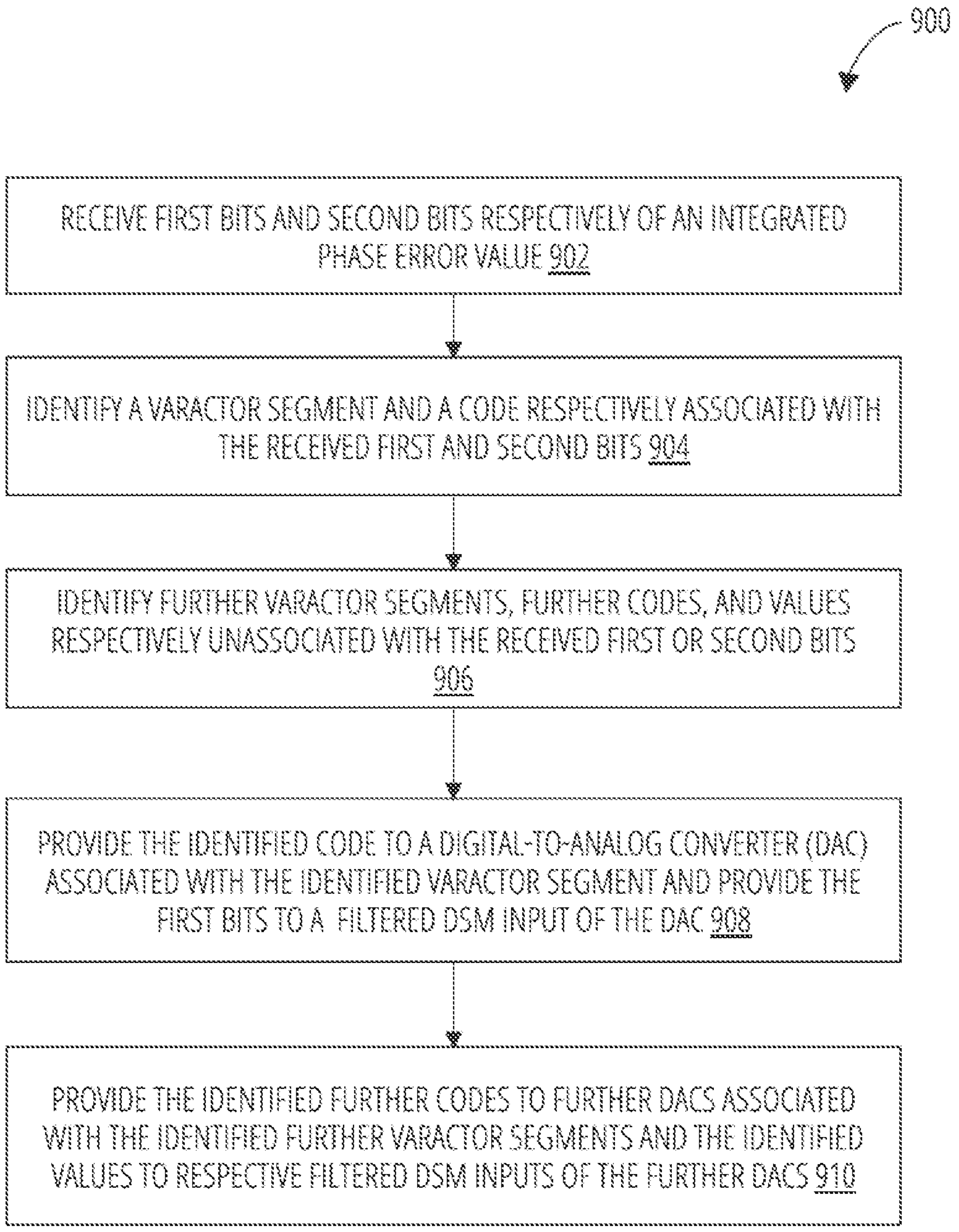
FIG. 9 is a flow diagram depicting a process for mapping second bits of integrated phase error values to codes and varactor segments, in accordance with one or more examples.

FIG. 9 is a flow diagram depicting a process 900 for mapping second bits of integrated phase error values to codes and varactor segments, in accordance with one or more examples. Process 900 may be performed, as a non-limiting example, by mapping logic 426 of FIG. 4 to control multiple varactor segments as discussed herein.

At operation 902, process 900 receives first bits (e.g., first bits 204) and second bits (e.g., second bits 206) respectively of an integrated phase error value (e.g., integrated phase error value 218).

At operation 904, process 900 identifies a varactor segment (e.g., one of varactor segments 402, 406, 408, or 410 specified in table 600) and a code (e.g., one of the predetermined codes specified in fields of table 600) respectively associated with the received second bits (e.g., in fields corresponding to the row of table 600 that includes the values of the second bits, and the columns of table 600 identified by dashed outlines).

At operation 906, identify further varactor segments, further codes, and values respectively unassociated with the received second bits.

At operation 908, provide the identified code to a digital-to-analog converter (DAC) associated with the identified varactor segment (e.g., DAC 432, 434, 436, or 438 specified in table 600), and provides the first bits to an input of a filtered DSM associated with the DAC (e.g., filtered DSM 404, 412, 418, or 422 specified in table 600).

At operation 910, provide the identified further codes to further DACs (e.g., other ones of DAC 432, 434, 436, or 438 specified in table 600) associated with the identified further varactor segments, and provides a value to an input of respective filtered DSM associated with the further DACs (e.g., provides a 0 to other ones of filtered DSM 404, 412, 418, or 422 specified in table 600).

Clock Tracking Circuit Examples

Figure 10:
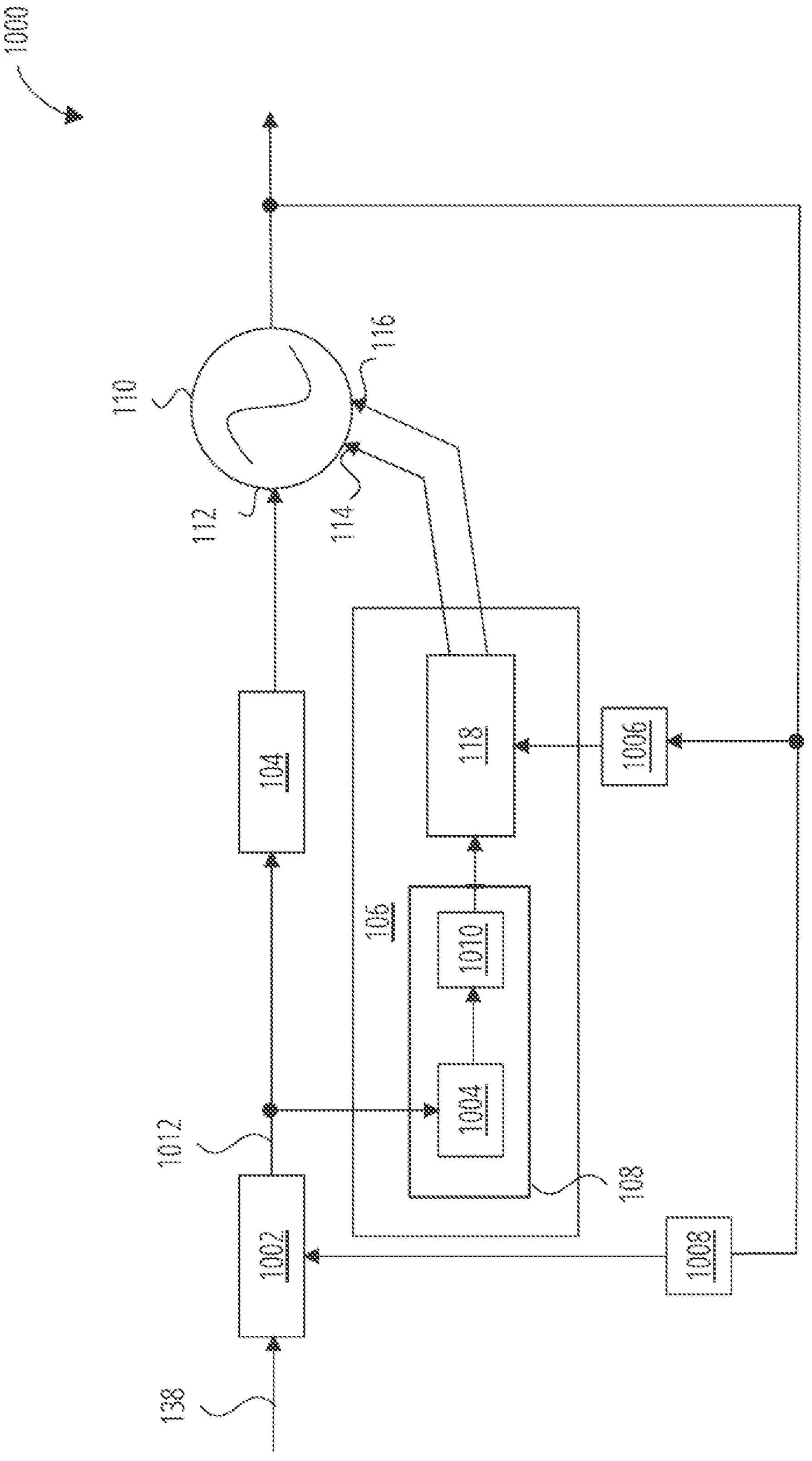
FIG. 10 s a block diagram depicting an apparatus for tracking a clock, in accordance with one or more examples.

FIG. 10 is a block diagram depicting an apparatus 1000 for tracking a clock, in accordance with one or more examples. Apparatus 1000 is a non-limiting example of a topology for apparatus 100. Apparatus 1000 includes a phase/frequency detector 1002, an analog proportional path 104, a digital integral path 106, a digital and analog controlled oscillator 110, a first frequency divider 1006, and a second frequency divider 1008. Digital integral path 106 includes a digital phase detector and integrator 108 and an interface 118. Digital phase detector and integrator 108 includes a binary phase detector 1004 and a digital integrator 1010. Digital and analog controlled oscillator 110 includes an analog proportional input 112, a digital integral input 114 and an analog integral input 116.

Phase/frequency detector 1002 compares two signals, e.g., a reference signal 138 and a feedback signal depicted by second frequency divider 1008 and generates an analog phase error signal 1012 that may include two component signals that respectively indicate whether phase or frequency of reference signal 138 and a feedback signal provided by second frequency divider 1008 differ, and a magnitude of such difference. As a non-limiting example, respective component signals output by phase/frequency detector 1002 may be generated as respective pulse streams where differences in arrival times of respective pulses of the pulse streams indicate a difference in phase or frequency, and the magnitude of respective pulses may be proportional to the magnitude of the difference. When the two pulse streams are subtracted and digitally integrated, the value (i.e., the integrated signal) is indicative of frequency differences between the reference signal and the feedback signal. In one or more examples, phase/frequency detector 1002 may perform single ended signal detection or differential signal detection.

Binary phase detector 1004 compares arriving edges of the respective component signals of the analog phase error signal 1012 generated by phase/frequency detector 1002 and determines positive and negative phase differences (e.g., subtracts the two component signals, without limitation), to generate a digital phase error signal that may utilized to determine phase and frequency error information. In one or more examples, binary phase detector 1004 may be any binary phase detector without exceeding the scope of this disclosure, as a non-limiting example, a bang-bang phase detector.

Digital integrator 1010 integrates the digital phase error signal over a period of time to generate a digital frequency error signal and is a non-limiting example of digital integrator 212.

First frequency divider 1006 provides a frequency divided output of digital and analog controlled oscillator 110 to interface 118 for clocking the DSM 126 as discussed above. Second frequency divider 1008 provides a further frequency divided output of digital and analog controlled oscillator 110 to phase/frequency detector 1002.

Figure 11:
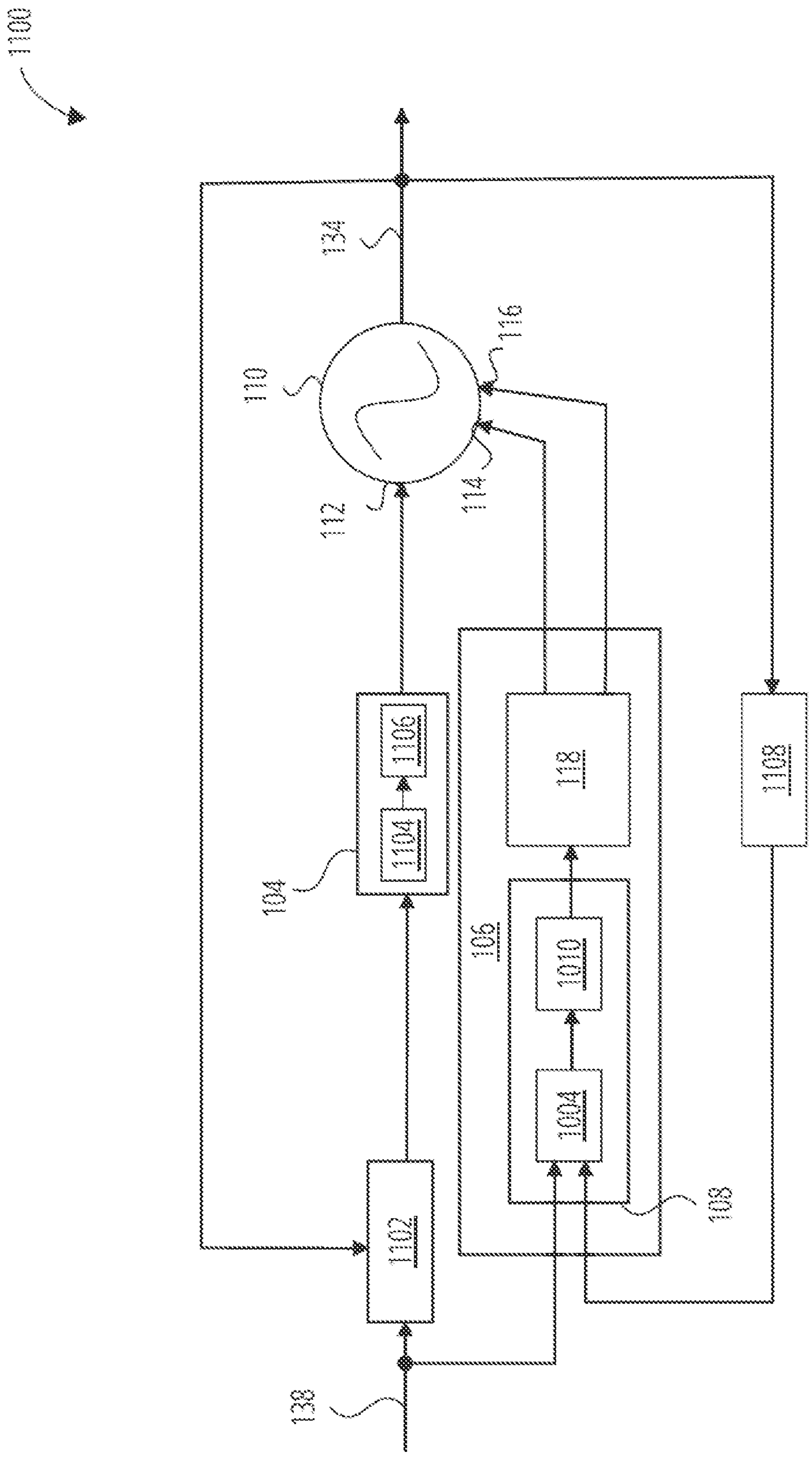
FIG. 11 is a diagram depicting an apparatus for tracking a clock, in accordance with one or more examples.
Figure 12:
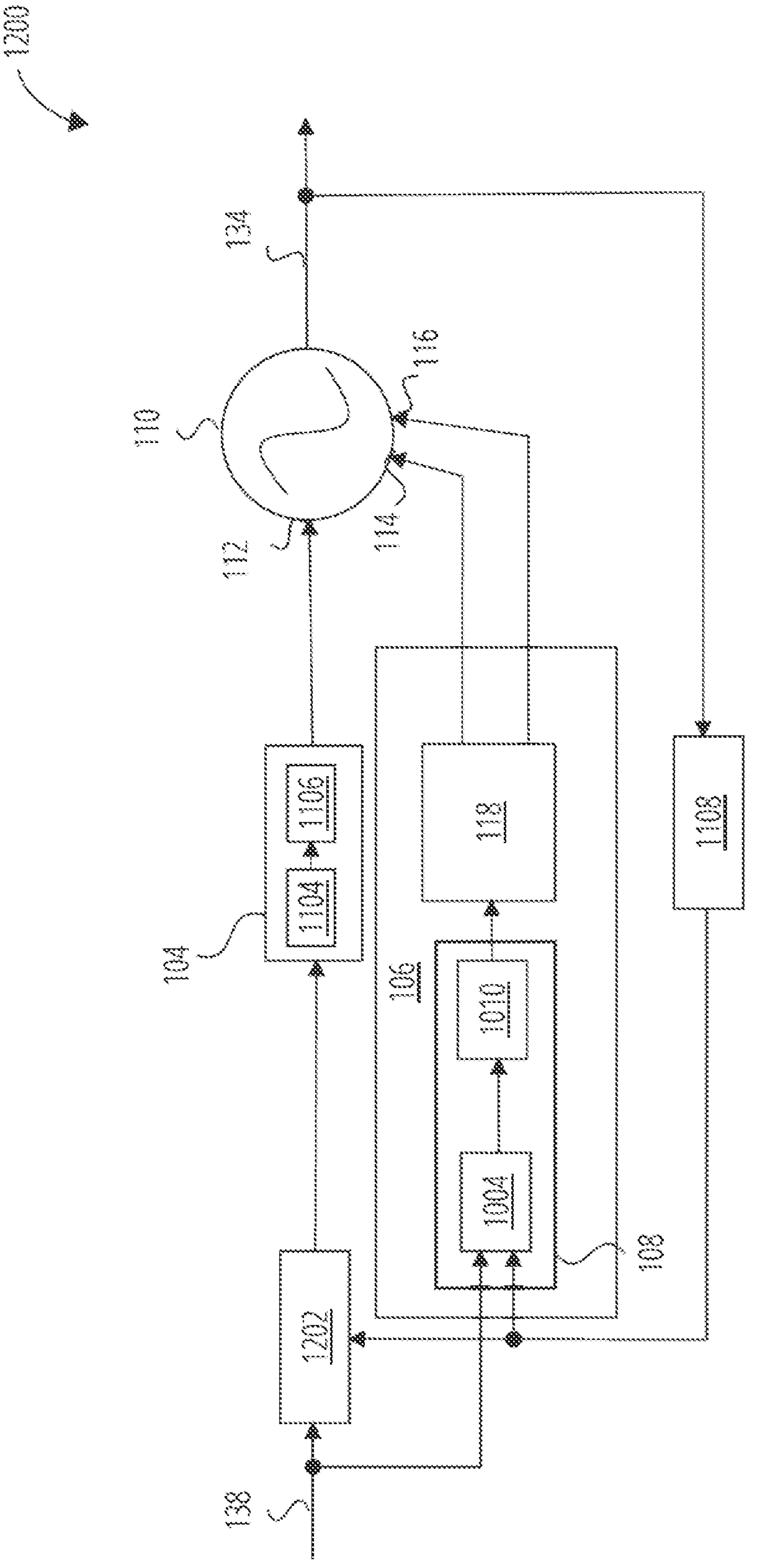
FIG. 12 is a diagram depicting an apparatus for tracking a clock, in accordance with one or more examples.
Figure 13:
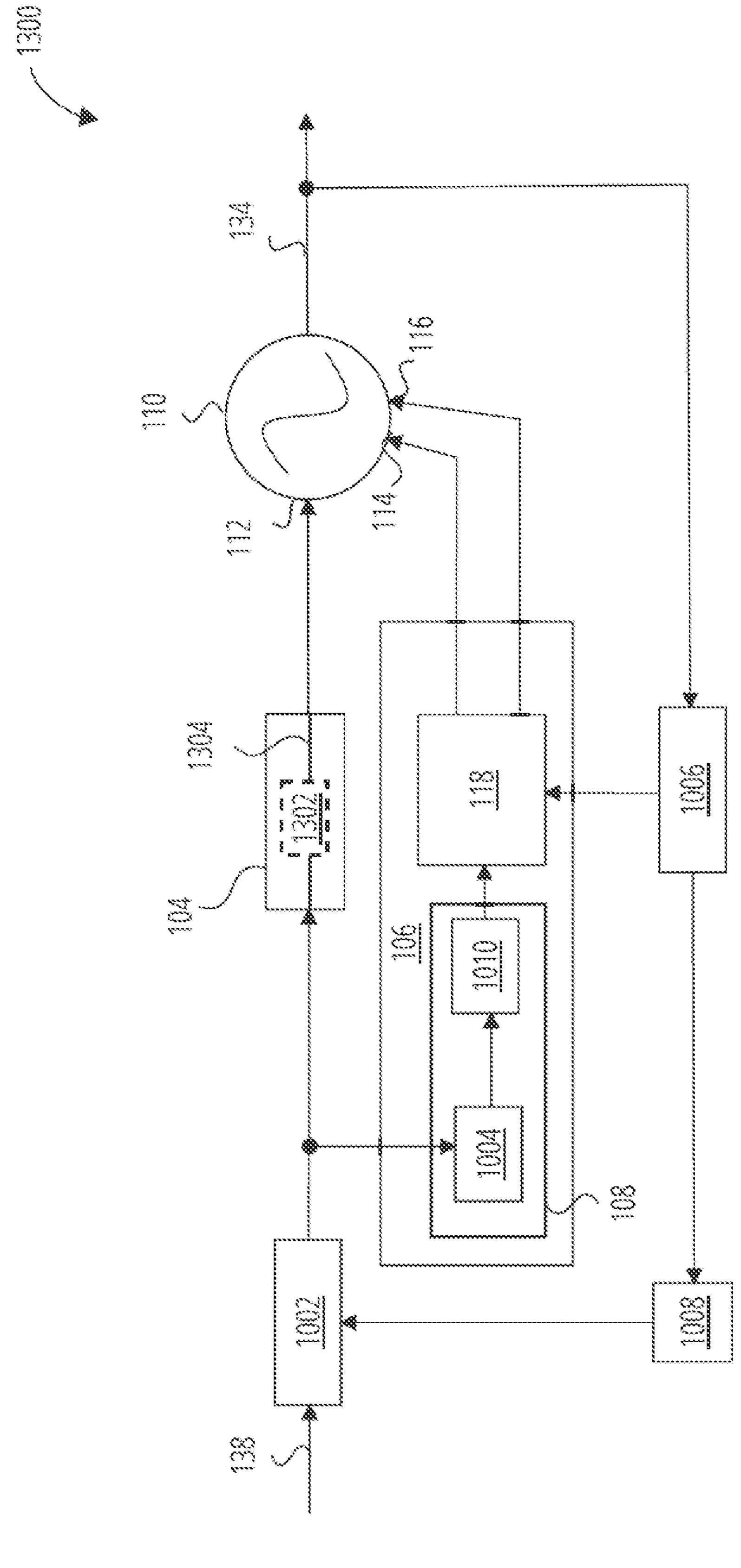
FIG. 13 is a diagram depicting an apparatus for tracking a clock that utilizes a direct connection between the output of a phase detector and an analog proportional input, in accordance with one or more examples.

FIG. 11, FIG. 12 and FIG. 13 illustrate different example topologies for apparatus 100 to improve analog proportional path 104 and reduce close-in phase noise exhibited by apparatus 100.

FIG. 11 is a diagram depicting an apparatus 1100 for tracking a clock, in accordance with one or more examples. Apparatus 1100 includes a subsampling phase detector 1102, an analog proportional path 104, a digital integral path 106, a digital and analog controlled oscillator 110, and a frequency divider 1108. Digital integral path 106 includes a digital phase detector and integrator 108 and an interface 118. Digital and analog controlled oscillator 110 includes an analog proportional input 112, a digital integral input 114, and an analog integral input 116. Analog proportional path 104 includes a voltage-to-current converter 1104 and a loop filter 1106. Digital phase detector and integrator 108 includes a binary phase detector 1004 and a digital integrator 1010.

Subsampling phase detector 1102 utilizes reference signal 138 to sample output signal 134 generated by digital and analog controlled oscillator 110 and, responsive to the sampled output signal 134, generates a phase error detection signal (e.g., an analog voltage signal, without limitation) that includes information about the phase error between reference signal 138 and output signal 134. The subsampling phase detector 1102 is followed by voltage-to-current converter 1104 and loop filter 1106 coupled (optionally directly or indirectly coupled to analog proportional input 112) to provide an analog voltage to the analog proportional input 112.

Among other things, utilizing subsampling phase detector 1102 reduces close-in phase noise as compared to utilizing a phase/frequency detector 1002.

FIG. 12 is a diagram depicting an apparatus 1200 for tracking a clock, in accordance with one or more examples. Apparatus 1200 is a non-limiting example of a topology for apparatus 100.

Apparatus 1200 includes a sampling phase detector 1202, an analog proportional path 104, a digital integral path 106, a digital and analog controlled oscillator 110, and a frequency divider 1108. Digital and analog controlled oscillator 110 includes an analog proportional input 112, a digital integral input 114, and an analog integral input 116. Analog proportional path 104 includes a voltage-to-current converter 1104 and a loop filter 1106. Digital integral path 106 includes a digital phase detector and integrator 108 and an interface 118. Digital phase detector and integrator 108 includes a binary phase detector 1004 and a digital integrator 1010.

Sampling phase detector 1202 utilizes a frequency divided version of output signal 134 generated by frequency divider 1108 to sample reference signal 138.

Sampling phase detector 1202 reduces close-in phase noise exhibited by apparatus 1000 as compared to, as a non-limiting example, phase/frequency detector 1002.

In one or more examples, analog proportional path 104 may include one or more of a charge pump, a voltage-to-current converter, or a low pass filter. Such components respectively provide additional degrees of freedom to control oscillator frequency gain via an analog proportional input. However, the inventors of this disclosure appreciate that charge pumps and voltage-to-current converters along the signal path of an analog proportional path respectively may introduce close-in phase noise, and so there may be trade-offs between degrees of freedom to control oscillator frequency gain via an analog proportional input and phase noise.

FIG. 13 is a diagram depicting an apparatus 1300 for tracking a clock that utilizes a direct connection between the output of a phase detector and an analog proportional input 112, in accordance with one or more examples. Apparatus 1300 is a non-limiting example of a topology for apparatus 100.

Apparatus 1300 includes a phase/frequency detector 1002, an analog proportional path 104, a digital integral path 106, a digital and analog controlled oscillator 110, a first frequency divider 1006, and a second frequency divider 1008. Digital integral path 106 includes a digital phase detector and integrator 108 and an interface 118. Digital phase detector and integrator 108 includes a binary phase detector 1004 and a digital integrator 1010. Digital and analog controlled oscillator 110 includes an analog proportional input 112, a digital integral input 114 and an analog integral input 116. Analog proportional path 104 includes a direct coupling 1304 and an optional low pass filter 1302.

In the example topology depicted by FIG. 13, an output of phase/frequency detector 1002 is coupled to analog proportional input 112 via direct coupling 1304 or optional low pass filter 1302 of analog proportional path 104. If optional low pass filter 1302 is not present, an output of phase/frequency detector 1002 is directly coupled with analog proportional input 112 via direct coupling 1304. A direct connection between phase/frequency detector 1002 and analog proportional input 112 via analog proportional path 104 or connection via low pass filter 1302 reduces close-in phase noise relative to topologies that incorporate a charge pump or voltage-to-current converter.

Figure 14:
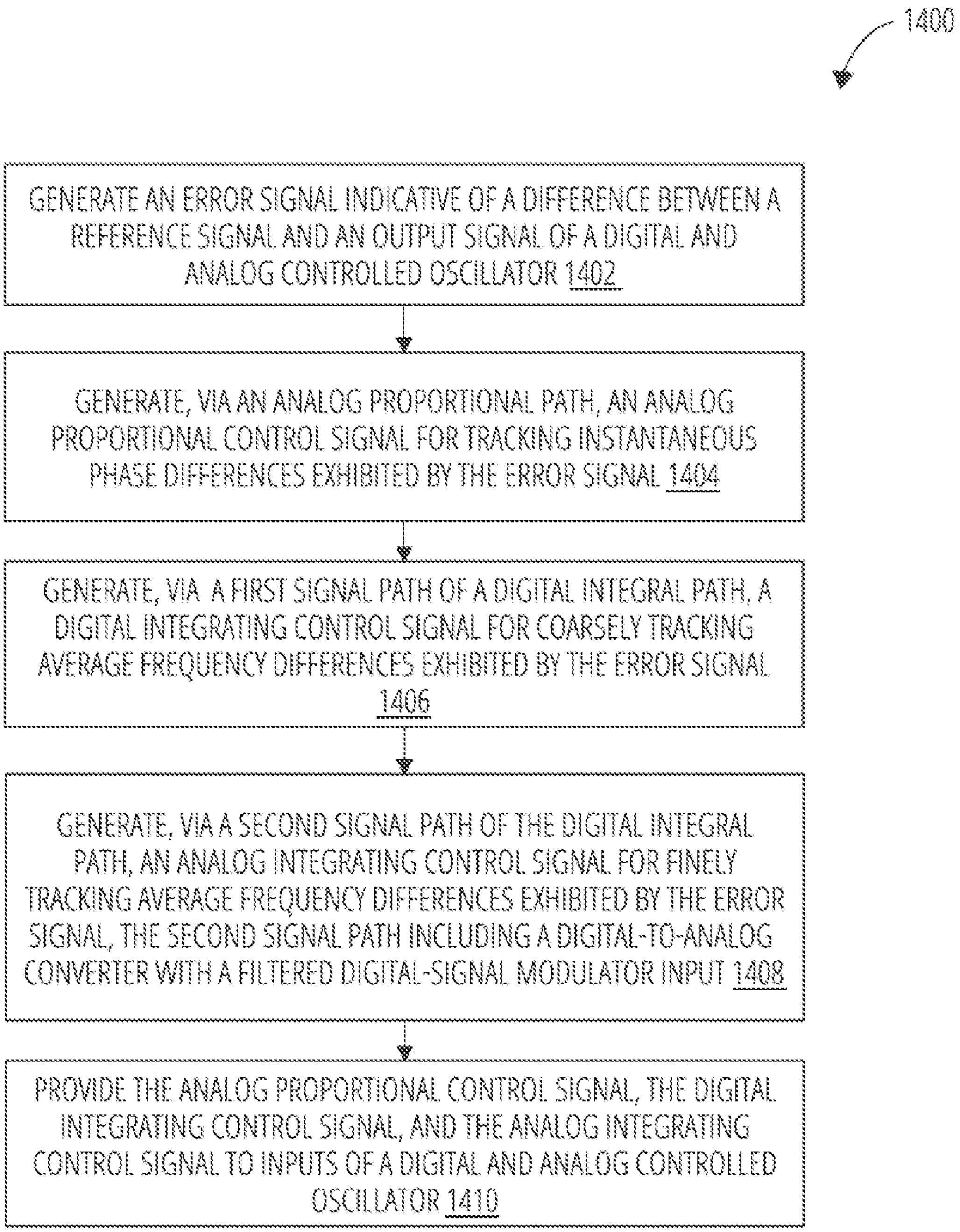
FIG. 14 is a flow chart depicting a process for interfacing a digital integral path with inputs of a digital and analog controlled oscillator, in accordance with one or more examples.

FIG. 14 is a flow chart depicting a process 1400 for interfacing a digital integral path with inputs of a digital and analog controlled oscillator, in accordance with one or more examples.

At operation 1402, process 1400 generates an error signal. In one or more examples, the error signal may be an analog phase error signal or a digital phase error signal, as discussed herein. The error signal may be indicative of difference (e.g., phase and frequency differences, without limitation) between a reference signal and an output signal of a digital and analog controlled oscillator d, and more specifically, represented differences between the reference signal and a feedback signal indicative of the output signal.

At operation 1404, process 1400 generates, via an analog proportional path, an analog proportional control signal (e.g., analog proportional control signal 136 generated via analog proportional path 104, without limitation) at least partially responsive to the error signal. The analog proportional control signal is for tracking instantaneous phase differences exhibited by the error signal.

At operation 1406, process 1400 generates, via a first signal path of a digital integral path, a digital integrating control signal (e.g., digital integrating control signal 144 generated via first signal path 120 of digital integral path 106, without limitation) at least partially responsive to the error signal. The digital integrating control signal may be for coarsely tracking average frequency differences exhibit by the error signal of operation 1402. The first signal path of the digital integral path may include a direct coupling (e.g., direct coupling 122, without limitation) to the digital integral input of the digital and analog controlled oscillator.

At operation 1408, process 1400 generates, via a second signal path of the digital integral path, an analog integrating control signal (e.g., analog integrating control signal 142 generated via second signal path 124 of digital integral path 106, without limitation) responsive to the error signal. The analog integrating control signal is for finely tracking average frequency differences exhibit by the error signal of operation 1402. The second signal path may include a DAC (e.g., DAC 130, without limitation) with a filtered DSM input (e.g., DSM 126 having an output coupled to a filter 128, without limitation).

At operation 1410, process 1400 provides the analog proportional control signal, the digital integrating control signal, and the analog integrating control signal to respective inputs of a digital and analog controlled oscillator.

Figure 15:
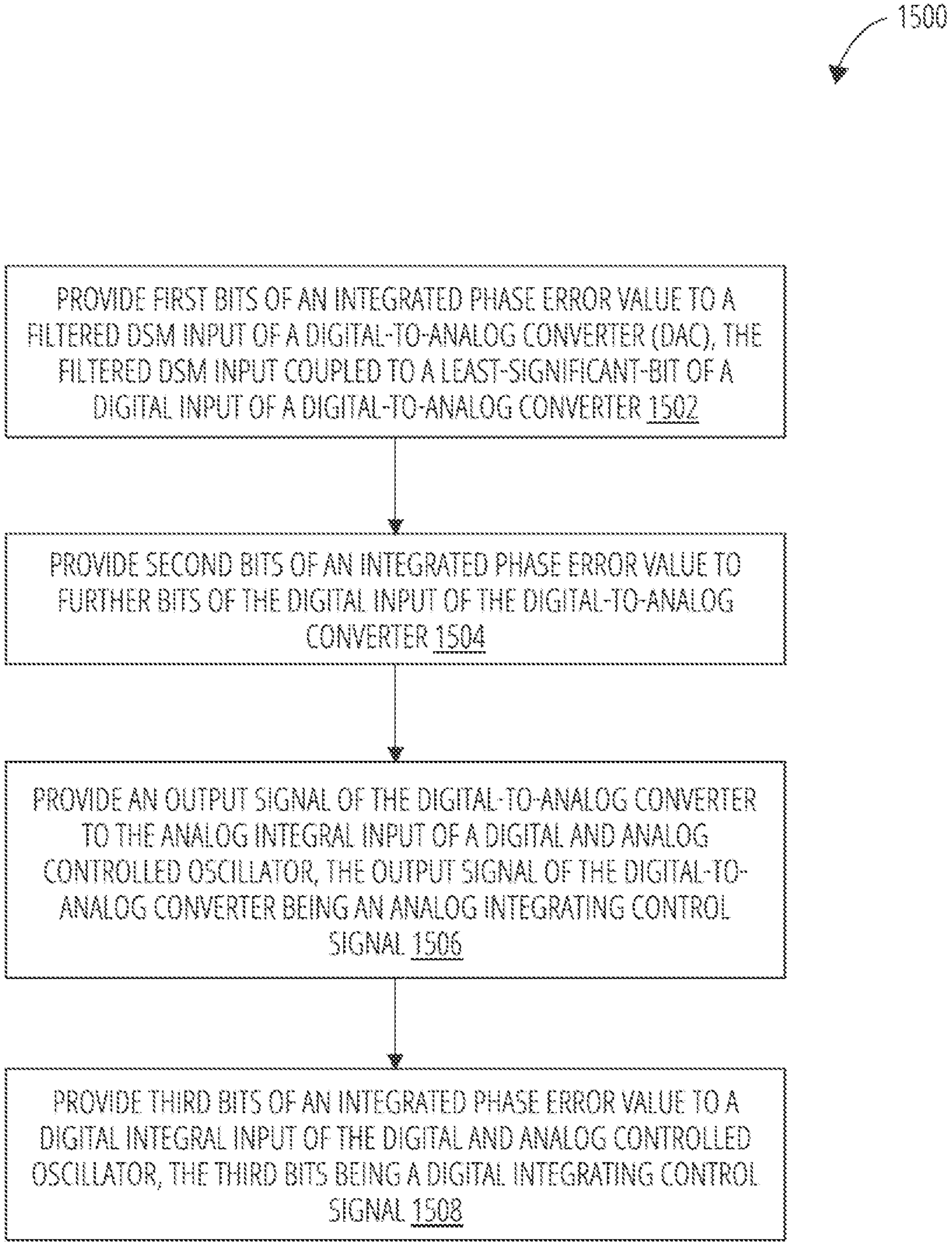
FIG. 15 is a flow chart depicting a process for interfacing a digital integral path with inputs of a digital and analog controlled oscillator, in accordance with one or more examples.

FIG. 15 is a flow chart depicting a process 1500 for interfacing a digital integral path with inputs of a digital and analog controlled oscillator, in accordance with one or more examples.

At operation 1502, process 1500 provides first bits (e.g., first bits 204, without limitation) of an integrated phase error value (e.g., integrated phase error value 218, without limitation) to a filtered DSM (e.g., to an input of DSM 126 having an output coupled to an input of filter 128, without limitation) coupled to a least-significant-bit of a digital input of a digital-to-analog converter (e.g., a least-significant bit of digital input 214 of DAC 130, without limitation).

At operation 1504, process 1500 provides second bits (e.g., second bits 206, without limitation) of an integrated phase error value (e.g., integrated phase error value 218, without limitation) to further bits of the digital input of the digital-to-analog converter (e.g., the next most significant bits after the LSB of digital input 214 of DAC 130, without limitation).

At operation 1506, process 1500 provide an output signal of the digital-to-analog converter (e.g., an output signal of DAC 130, without limitation) to the analog integral input of a digital and analog controlled oscillator (e.g., the analog integral input 116 of digital and analog controlled oscillator 110, without limitation), the output signal of the digital-to-analog converter being an analog integrating control signal (e.g., analog integrating control signal 142, without limitation).

At operation 1508, process 1500 provide third bits (e.g., third bits 216, without limitation) of an integrated phase error value (e.g., integrated phase error value 218, without limitation) to a digital integral input of the digital and analog controlled oscillator (e.g., digital integral input 114 of digital and analog controlled oscillator 110, without limitation), the third bits being a digital integrating control signal (e.g., digital integrating control signal 144, without limitation).

Figure 16:
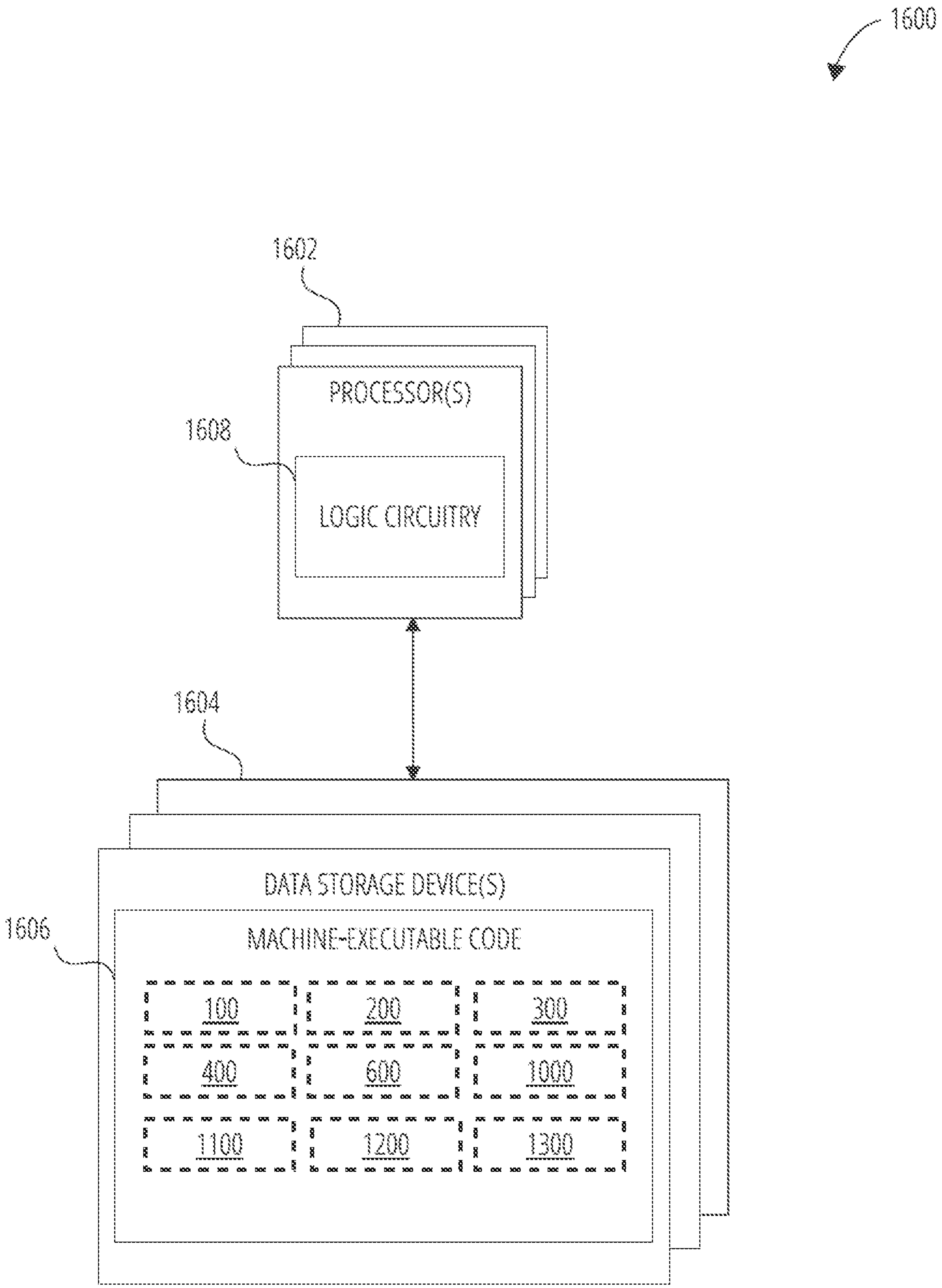
FIG. 16 is a block diagram of circuitry that, in some examples, may be used to implement various functions, operations, acts, processes, and/or methods disclosed herein.

It will be appreciated by those of ordinary skill in the art that functional elements of examples disclosed herein (e.g., functions, operations, acts, processes, and/or methods) may be implemented in any suitable hardware, software, firmware, or combinations thereof. FIG. 16 illustrates non-limiting examples of implementations of functional elements disclosed herein. In some examples, some or all portions of the functional elements disclosed herein may be performed by hardware specially configured for carrying out the functional elements.

FIG. 16 is a block diagram of circuitry 1600 that, in some examples, may be used to implement various functions, operations, acts, processes, and/or methods disclosed herein. The circuitry 1600 includes one or more processors 1602 (sometimes referred to herein as "processors 1602") operably coupled to one or more data storage devices (sometimes referred to herein as "storage 1604"). The storage 1604 includes machine-executable code 1606 stored thereon and the processors 1602 include logic circuitry 1608. The machine-executable code 1606 includes information describing functional elements that may be implemented by (e.g., performed by) the logic circuitry 1608. The logic circuitry 1608 is adapted to implement (e.g., perform) the functional elements described by the machine-executable code 1606. The circuitry 1600, when executing the functional elements described by the machine-executable code 1606, should be considered as special purpose hardware configured for carrying out functional elements disclosed herein. In some examples, the processors 1602 may be configured to perform the functional elements described by the machine-executable code 1606 sequentially, concurrently (e.g., on one or more different hardware platforms), or in one or more parallel process streams.

When implemented by logic circuitry 1608 of the processors 1602, the machine-executable code 1606 is configured to adapt the processors 1602 to perform operations of examples disclosed herein. By way of non-limiting example, the machine-executable code 1606 may be configured to adapt the processors 1602 to perform some or a totality of operations of example clock tracking discussed herein, including one or more of process 900, process 1400, or process 1500.

Also by way of non-limiting example, the machine-executable code 1606 may be configured to adapt the processors 1602 to perform some or a totality of features, functions, or operations disclosed herein for one or more of: apparatus 100, PLL portion 200, DAC 300, PLL portion 400, table 600, apparatus 1000, apparatus 1100, apparatus 1200, or apparatus 1300. More specifically, features, functions, or operations disclosed herein for one or more of: error detector 102, analog proportional path 104, digital integral path 106, digital phase detector and integrator 108, digital and analog controlled oscillator 110, analog proportional input 112, digital integral input 114, analog integral input 116, interface 118, first signal path 120, direct coupling 122, second signal path 124, DSM 126, filter 128, or DAC 130; accumulation register 202, LSB input 208, binary phase error detector 210, digital integrator 212, or digital input 214; selectable gain paths 302, selection circuit 306, configurable input 308, digital-to-analog conversion path 310, or output 312; mapping logic 426, varactor region 448, varactor segments 402, 406, 410, or 414, filtered DSM inputs 404, 412, 418, or 422, DACs 432, 434, 436, or 438, varactors 408, 416, 420, or 424; phase/frequency detector 1002, binary phase detector 1004, digital integrator 1010, first frequency divider 1006, or second frequency divider 1008; subsampling phase detector 1102, voltage to current converter 1104, loop filter 1106, or frequency divider 1108; sampling phase detector 1202; or low pass filter 1302 or direct coupling 1304.

The processors 1602 may include a general purpose processor, a special purpose processor, a central processing unit (CPU), a microcontroller, a programmable logic controller (PLC), a digital signal processor (DSP), an application specific integrated circuit (ASIC), a field-programmable gate array (FPGA) or other programmable logic device, discrete gate or transistor logic, discrete hardware components, other programmable device, or any combination thereof designed to perform the functions disclosed herein. A general-purpose computer including a processor is considered a special-purpose computer while the general-purpose computer is configured to execute functional elements corresponding to the machine-executable code 1606 (e.g., software code, firmware code, hardware descriptions) related to examples of the present disclosure. It is noted that a general-purpose processor (may also be referred to herein as a host processor or simply a host) may be a microprocessor, but in the alternative, the processors 1602 may include any conventional processor, controller, microcontroller, or state machine. The processors 1602 may also be implemented as a combination of computing devices, such as a combination of a DSP and a microprocessor, a plurality of microprocessors, one or more microprocessors in conjunction with a DSP core, or any other such configuration.

In some examples, the storage 1604 includes volatile data storage (e.g., random-access memory (RAM)), non-volatile data storage (e.g., Flash memory, a hard disc drive, a solid-state drive, erasable programmable read-only memory (EPROM), etc.). In some examples, the processors 1602 and the storage 1604 may be implemented into a single device (e.g., a semiconductor device product, a system on chip (SOC), etc.). In some examples, the processors 1602 and the storage 1604 may be implemented into separate devices.

In some examples, the machine-executable code 1606 may include computer-readable instructions (e.g., software code, firmware code). By way of non-limiting example, the computer-readable instructions may be stored by the storage 1604, accessed directly by the processors 1602, and executed by the processors 1602 using at least the logic circuitry 1608. Also, by way of non-limiting example, the computer-readable instructions may be stored on the storage 1604, transferred to a memory device (not shown) for execution, and executed by the processors 1602 using at least the logic circuitry 1608. Accordingly, in some examples, the logic circuitry 1608 includes electrically configurable logic circuitry 1608.

In some examples, the machine-executable code 1606 may describe hardware (e.g., circuitry) to be implemented in the logic circuitry 1608 to perform the functional elements. This hardware may be described at any of a variety of levels of abstraction, from low-level transistor layouts to high-level description languages. At a high level of abstraction, a hardware description language (HDL) such as an IEEE Standard hardware description language (HDL) may be used. By way of non-limiting examples, Verilog, SystemVerilog or very large-scale integration (VLSI) hardware description language (VHDL) may be used.

HDL descriptions may be converted into descriptions at any of numerous other levels of abstraction as desired. As a non-limiting example, a high-level description can be converted to a logic-level description such as a register-transfer language (RTL), a gate-level (GL) description, a layout-level description, or a mask-level description. As a non-limiting example, micro-operations to be performed by hardware logic circuits (e.g., gates, flip-flops, registers, without limitation) of the logic circuitry 1608 may be described in a RTL and then converted by a synthesis tool into a GL description, and the GL description may be converted by a placement and routing tool into a layout-level description that corresponds to a physical layout of an integrated circuit of a programmable logic device, discrete gate or transistor logic, discrete hardware components, or combinations thereof. Accordingly, in some examples, the machine-executable code 1606 may include an HDL, an RTL, a GL description, a mask level description, other hardware description, or any combination thereof.

In examples where the machine-executable code 1606 includes a hardware description (at any level of abstraction), a system (not shown, but including the storage 1604) may be configured to implement the hardware description described by the machine-executable code 1606. By way of non-limiting example, the processors 1602 may include a programmable logic device (e.g., an FPGA or a PLC) and the logic circuitry 1608 may be electrically controlled to implement circuitry corresponding to the hardware description into the logic circuitry 1608. Also, by way of non-limiting example, the logic circuitry 1608 may include hard-wired logic manufactured by a manufacturing system (not shown, but including the storage 1604) according to the hardware description of the machine-executable code 1606.

Regardless of whether the machine-executable code 1606 includes computer-readable instructions or a hardware description, the logic circuitry 1608 is adapted to perform the functional elements described by the machine-executable code 1606 when implementing the functional elements of the machine-executable code 1606. It is noted that although a hardware description may not directly describe functional elements, a hardware description indirectly describes functional elements that the hardware elements described by the hardware description are capable of performing.

As used in the present disclosure, the term "combination" with reference to a plurality of elements may include a combination of all the elements or any of various different subcombinations of some of the elements. For example, the phrase "A, B, C, D, or combinations thereof" may refer to any one of A, B, C, or D; the combination of each of A, B, C, and D; and any subcombination of A, B, C, or D such as A, B, and C; A, B, and D; A, C, and D; B, C, and D; A and B; A and C; A and D; B and C; B and D; or C and D.

Terms used in the present disclosure and especially in the appended claims (e.g., bodies of the appended claims, without limitation) are generally intended as "open" terms (e.g., the term "including" should be interpreted as "including, but not limited to," the term "having" should be interpreted as "having at least," the term "includes" should be interpreted as "includes, but is not limited to," without limitation). As used herein, the term "each" means some or a totality. As used herein, the term "each and every" means a totality.

Additionally, if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to examples containing only one such recitation, even when the same claim includes the introductory phrases "one or more" or "at least one" and indefinite articles such as "a" or "an" (e.g., "a" and/or "an" should be interpreted to mean "at least one" or "one or more," without limitation); the same holds true for the use of definite articles used to introduce claim recitations.

In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations, without limitation). Furthermore, in those instances where a convention analogous to "at least one of A, B, and C, etc." or "one or more of A, B, and C, etc." is used, in general such a construction is intended to include A alone, B alone, C alone, A and B together, A and C together, B and C together, or A, B, and C together, etc.

Further, any disjunctive word or phrase presenting two or more alternative terms, whether in the description, claims, or drawings, should be understood to contemplate the possibilities of including one of the terms, either of the terms, or both terms. For example, the phrase "A or B" should be understood to include the possibilities of "A" or "B" or "A and B."

Additional non-limiting examples may include:

Example 1: An apparatus, comprising: an error detector; a digital and analog controlled oscillator comprising: an analog proportional input, a digital integral input, and an analog integral input; an analog proportional path to provide a control signal for the analog proportional input of the digital and analog controlled oscillator; and a digital integral path to provide control signals for the digital integral input and the analog integral input of the digital and analog controlled oscillator, the digital integral path comprising: a digital phase detector and integrator; and an interface, wherein a first signal path of the interface includes a direct coupling between the digital phase detector and integrator and the digital integral input of the digital and analog controlled oscillator, and wherein a second signal path of the interface includes a digital-to-analog converter (DAC) with a filtered delta-sigma modulator (DSM) input between the digital phase detector and integrator and the analog integral input of the digital and analog controlled oscillator.

Example 2: The apparatus according to Example 1, wherein the digital integral path comprises: a digital phase detector to convert a phase error signal generated by the error detector to a digital phase error signal; a register to store an integrated phase error value accumulated from the digital phase error signal; a delta-sigma modulator (DSM) coupled to receive first bits of the integrated phase error value stored at the register and generate a switching signal representative of the first bits of the integrated phase error value; a filter coupled to low pass filter the switching signal to generate a filtered switching signal; and a digital-to-analog converter (DAC) comprising: a digital input coupled to receive second bits of the integrated phase error value stored at the register; a control input coupled to receive the filtered switching signal; and an output coupled to the analog integral input of the digital and analog controlled oscillator.

Example 3: The apparatus according to any of Examples 1 and 2, wherein the DAC comprises: a configurable input including multiple gain paths to respectively exhibit predetermined gains; and a selection circuit to selectively couple an output of the DSM to ones of the multiple gain paths.

Example 4: The apparatus according to any of Examples 1 through 3, wherein the DAC with the filtered DSM input comprises multiple DACs with respective filtered DSM inputs, and wherein the analog integral input includes multiple varactors.

Example 5: The apparatus according to any of Examples 1 through 4, comprising a mapping logic to selectively provide codes to the multiple DACS with filtered DSM inputs at least partially responsive to first and second bits of an integrated phase error value.

Example 6: The apparatus according to any of Examples 1 through 5, wherein respective varactors of the multiple varactors to operate in predetermined operating regions.

Example 7: The apparatus according to any of Examples 1 through 6, wherein the error detector is a phase/frequency detector.

Example 8: The apparatus according to any of Examples 1 through 7, wherein the error detector is a subsampling phase detector.

Example 9: The apparatus according to any of Examples 1 through 8, wherein an input of the subsampling phase detector is coupled to an output of the digital and analog controlled oscillator.

Example 10: The apparatus according to any of Examples 1 through 9, wherein the analog proportional path comprises a voltage-to-current converter and low pass filter to couple an output of the error detector to the analog proportional input of the digital and analog controlled oscillator.

Example 11: The apparatus according to any of Examples 1 through 10, wherein the error detector is a sampling phase detector.

Example 12: The apparatus according to any of Examples 1 through 11, wherein an input of the sampling phase detector is coupled to an output of the digital and analog controlled oscillator via a frequency divider.

Example 13: The apparatus according to any of Examples 1 through 12, wherein the analog proportional path comprises a low pass filter to directly couple an output of the error detector to the proportional input of the digital and analog controlled oscillator.

Example 14: The apparatus according to any of Examples 1 through 13, wherein the analog proportional path comprises a voltage-to-current converter and loop filter to directly couple an output of the error detector to the proportional input of the digital and analog controlled oscillator.

Example 15: A method, comprising: generating an error signal indicative of a difference between a reference signal and an output of a digital and analog controlled oscillator; generating, via an analog proportional path, an analog proportional control signal for tracking instantaneous phase differences exhibited by the error signal; generating, via a first signal path of a digital integral path, a digital integrating control signal for coarsely tracking average frequency differences exhibited by the error signal; generating, via a second signal path of the digital integral path, an analog integrating control signal for finely tracking average frequency differences exhibited by the error signal, wherein the second signal path including a digital-to-analog converter (DAC) with a filtered digital-signal modulator input; and providing the analog proportional control signal, the digital integrating control signal, and the continuous analog integrating control signal to respective inputs of a digital and analog controlled oscillator.

Example 16: The method according to Example 15, wherein generating, via the first signal path of the digital integral path, the analog proportional control signal for instantaneous phase differences exhibited by the error signal comprises: providing third bits of an integrated phase error value to a digital integral input of the digital and analog controlled oscillator, wherein the third bits being the digital integrating control signal.

Example 17: The method according to any of Examples 15 and 16, wherein generating, via the first signal path of a digital integral path, the digital integrating control signal for coarsely tracking average frequency differences exhibited by the error signal comprises: provide first bits of an integrated phase error value to a filtered DSM input of a digital-to-analog converter (DAC), the filtered DSM input coupled to a least-significant-bit of a digital input of a digital-to-analog converter; provide second bits of an integrated phase error value to further bits of the digital input of the digital-to-analog converter; and provide an output signal of the digital-to-analog converter to an analog integral input of the digital and analog controlled oscillator, the output signal of the digital-to-analog converter being the analog integrating control signal.

Example 18: An apparatus, comprising: a segmented varactor; and multiple DACs with DSM filtered inputs, respective ones the multiple DACs with DSM filtered inputs coupled to respective varactor segments of the segmented varactor.

Example 19: The apparatus according to Example 18, comprising a mapping logic to selectively provide codes to the multiple DACS with filtered DSM inputs at least partially responsive to first and second bits of an integrated phase error value.

Example 20: The apparatus according to any of Examples 18 and 19, comprising an interface, wherein a first signal path of the interface includes a direct coupling between a digital phase detector and integrator and a digital integral input of the digital and analog controlled oscillator, and wherein a second signal path includes the multiple DACS with filtered DSM inputs arranged between the digital phase detector and integrator and the analog integral input of the digital and analog controlled oscillator.

While the present disclosure has been described herein with respect to certain illustrated examples, those of ordinary skill in the art will recognize and appreciate that the present invention is not so limited. Rather, many additions, deletions, and modifications to the illustrated and described examples may be made without departing from the scope of the invention as hereinafter claimed along with their legal equivalents. In addition, features from one example may be combined with features of another example while still being encompassed within the scope of the invention as contemplated by the inventor.

What is claimed is:

1. An apparatus, comprising:

an error detector;

a digital and analog controlled oscillator comprising: an analog proportional input, a digital integral input, and an analog integral input;

an analog proportional path to provide a control signal for the analog proportional input of the digital and analog controlled oscillator; and a digital integral path to provide control signals for the digital integral input and the analog integral input of the digital and analog controlled oscillator, the digital integral path comprising:

a digital phase detector and integrator; and an interface, wherein a first signal path of the interface includes a direct coupling between the digital phase detector and integrator and the digital integral input of the digital and analog controlled oscillator, and wherein a second signal path of the interface includes a digital-to-analog converter (DAC) with a filtered delta-sigma modulator (DSM) input between the digital phase detector and integrator and the analog integral input of the digital and analog controlled oscillator, the DAC comprising:

a digital input coupled to receive second bits of an integrated phase error value stored at a register; a control input coupled to receive a filtered switching signal; and an output coupled to the analog integral input of the digital and analog controlled oscillator.

2. An apparatus, comprising:

an error detector;

a digital and analog controlled oscillator comprising: an analog proportional input, a digital integral input, and an analog integral input;

an analog proportional path to provide a control signal for the analog proportional input of the digital and analog controlled oscillator; and a digital integral path to provide control signals for the digital integral input and the analog integral input of the digital and analog controlled oscillator, the digital integral path comprising:

a digital phase detector and integrator; and an interface, wherein a first signal path of the interface includes a direct coupling between the digital phase detector and integrator and the digital integral input of the digital and analog controlled oscillator, and wherein a second signal path of the interface includes a digital-to-analog converter (DAC) with a filtered delta-sigma modulator (DSM) input between the digital phase detector and integrator and the analog integral input of the digital and analog controlled oscillator, the DAC comprising:

a digital input coupled to receive second bits of an integrated phase error value stored at a register; a control input coupled to receive a filtered switching signal; and an output coupled to the analog integral input of the digital and analog controlled oscillator, wherein the digital phase detector and integrator comprises:

a digital phase detector to convert a phase error signal generated by the error detector to a digital phase error signal; and a register to store the integrated phase error value accumulated from the digital phase error signal, and wherein the digital integral path comprises:

a delta-sigma modulator (DSM) coupled to receive first bits of the integrated phase error value stored at the register and generate a switching signal representative of the first bits of the integrated phase error value;

a filter coupled to low pass filter the switching signal to generate a filtered switching signal; and a digital-to-analog converter (DAC) comprising:

a digital input coupled to receive second bits of the integrated phase error value stored at the register;

a control input coupled to receive the filtered switching signal; and an output coupled to the analog integral input of the digital and analog controlled oscillator.

3. The apparatus of claim 2, wherein the DAC comprises:

a configurable input including multiple gain paths to respectively exhibit predetermined gains; and a selection circuit to selectively couple an output of the DSM to ones of the multiple gain paths.

4. The apparatus of claim 1, wherein the DAC with the filtered DSM input comprises multiple DACs with respective filtered DSM inputs, and wherein the analog integral input includes multiple varactors.

5. An apparatus, comprising:

an error detector;

a digital and analog controlled oscillator comprising: an analog proportional input, a digital integral input, and an analog integral input;

an analog proportional path to provide a control signal for the analog proportional input of the digital and analog controlled oscillator; and a digital integral path to provide control signals for the digital integral input and the analog integral input of the digital and analog controlled oscillator, the digital integral path comprising:

a digital phase detector and integrator;

an interface, wherein a first signal path of the interface includes a direct coupling between the digital phase detector and integrator and the digital integral input of the digital and analog controlled oscillator, and wherein a second signal path of the interface includes a digital-to-analog converter (DAC) with a filtered delta-sigma modulator (DSM) input between the digital phase detector and integrator and the analog integral input of the digital and analog controlled oscillator, the DAC comprising:

a digital input coupled to receive second bits of an integrated phase error value stored at a register; a control input coupled to receive the filtered switching signal; and an output coupled to the analog integral input of the digital and analog controlled oscillator, wherein the DAC with the filtered DSM input comprises multiple DACs with respective filtered DSM inputs, and wherein the analog integral input includes multiple varactors; and a mapping logic to selectively provide codes to the multiple DACS with filtered DSM inputs at least partially responsive to first and second bits of an integrated phase error value.

6. The apparatus of claim 4, wherein respective varactors of the multiple varactors to operate in predetermined operating regions.

7. The apparatus of claim 1, wherein the error detector is a phase/frequency detector.

8. The apparatus of claim 1, wherein the error detector is a subsampling phase detector.

9. The apparatus of claim 8, wherein an input of the subsampling phase detector is coupled to an output of the digital and analog controlled oscillator.

10. An apparatus, comprising:

an error detector;

a digital and analog controlled oscillator comprising: an analog proportional input, a digital integral input, and an analog integral input;

an analog proportional path to provide a control signal for the analog proportional input of the digital and analog controlled oscillator; and a digital integral path to provide control signals for the digital integral input and the analog integral input of the digital and analog controlled oscillator, the digital integral path comprising:

a digital phase detector and integrator; and an interface, wherein a first signal path of the interface includes a direct coupling between the digital phase detector and integrator and the digital integral input of the digital and analog controlled oscillator, and wherein a second signal path of the interface includes a digital-to-analog converter (DAC) with a filtered delta-sigma modulator (DSM) input between the digital phase detector and integrator and the analog integral input of the digital and analog controlled oscillator, the DAC comprising:

a digital input coupled to receive second bits of an integrated phase error value stored at a register; a control input coupled to receive the filtered switching signal; and an output coupled to the analog integral input of the digital and analog controlled oscillator, wherein the analog proportional path comprises a voltage-to-current converter and low pass filter to couple an output of the error detector to the analog proportional input of the digital and analog controlled oscillator.

11. The apparatus of claim 1, wherein the error detector is a sampling phase detector.

12. The apparatus of claim 11, wherein an input of the sampling phase detector is coupled to an output of the digital and analog controlled oscillator via a frequency divider.

13. The apparatus of claim 1, wherein the analog proportional path comprises a low pass filter to directly couple an output of the error detector to the analog proportional input of the digital and analog controlled oscillator.

14. The apparatus of claim 1, wherein the analog proportional path comprises a voltage-to-current converter and loop filter to directly couple an output of the error detector to the analog proportional input of the digital and analog controlled oscillator.

15. A method, comprising:

generating an error signal indicative of a difference between a reference signal and an output of a digital and analog controlled oscillator;

generating, via an analog proportional path, an analog proportional control signal for tracking instantaneous phase differences exhibited by the error signal;

generating, via a first signal path of a digital integral path, a digital integrating control signal for coarsely tracking average frequency differences exhibited by the error signal;

generating, via a second signal path of the digital integral path, an analog integrating control signal for finely tracking average frequency differences exhibited by the error signal, wherein the second signal path including a digital-to-analog converter (DAC) with a filtered digital-signal modulator input; and providing the analog proportional control signal, the digital integrating control signal, and the continuous analog integrating control signal to respective inputs of a digital and analog controlled oscillator, wherein the DAC comprising:

a digital input coupled to receive second bits of an integrated phase error value stored at a register; a control input coupled to receive a filtered switching signal; and an output coupled to an analog integral input of the digital and analog controlled oscillator.

16. A method, comprising:

generating an error signal indicative of a difference between a reference signal and an output of a digital and analog controlled oscillator;

generating, via an analog proportional path, an analog proportional control signal for tracking instantaneous phase differences exhibited by the error signal;

generating, via a first signal path of a digital integral path, a digital integrating control signal for coarsely tracking average frequency differences exhibited by the error signal;

generating, via a second signal path of the digital integral path, an analog integrating control signal for finely tracking average frequency differences exhibited by the error signal, wherein the second signal path including a digital-to-analog converter (DAC) with a filtered digital-signal modulator input; and providing the analog proportional control signal, the digital integrating control signal, and the continuous analog integrating control signal to respective inputs of a digital and analog controlled oscillator, wherein generating, via the first signal path of the digital integral path, the analog proportional control signal for instantaneous phase differences exhibited by the error signal comprises:

providing third bits of an integrated phase error value to a digital integral input of the digital and analog controlled oscillator, wherein the third bits being the digital integrating control signal.

17. A method, comprising:

generating an error signal indicative of a difference between a reference signal and an output of a digital and analog controlled oscillator;

generating, via an analog proportional path, an analog proportional control signal for tracking instantaneous phase differences exhibited by the error signal;

generating, via a first signal path of a digital integral path, a digital integrating control signal for coarsely tracking average frequency differences exhibited by the error signal;

generating, via a second signal path of the digital integral path, an analog integrating control signal for finely tracking average frequency differences exhibited by the error signal, wherein the second signal path including a digital-to-analog converter (DAC) with a filtered digital-signal modulator input; and providing the analog proportional control signal, the digital integrating control signal, and the continuous analog integrating control signal to respective inputs of a digital and analog controlled oscillator, wherein generating, via the first signal path of a digital integral path, the digital integrating control signal for coarsely tracking average frequency differences exhibited by the error signal comprises:

provide first bits of an integrated phase error value to a filtered DSM input of a digital-to-analog converter (DAC), the filtered DSM input coupled to a least-significant-bit of a digital input of a digital-to-analog converter;

provide second bits of an integrated phase error value to further bits of the digital input of the digital-to-analog converter; and provide an output signal of the digital-to-analog converter to an analog integral input of the digital and analog controlled oscillator, the output signal of the digital-to-analog converter being the analog integrating control signal.

* * * * *